(12) United States Patent
Ibata

(10) Patent No.: US 11,746,189 B2
(45) Date of Patent: Sep. 5, 2023

(54) HARD-MASK FORMING COMPOSITION, METHOD FOR MANUFACTURING ELECTRONIC COMPONENT, AND RESIN

(71) Applicant: TOKYO OHKA KOGYO CO., LTD., Kawasaki (JP)

(72) Inventor: Keiichi Ibata, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 430 days.

(21) Appl. No.: 17/175,182

(22) Filed: Feb. 12, 2021

(65) Prior Publication Data

US 2021/0261731 A1    Aug. 26, 2021

(30) Foreign Application Priority Data

Feb. 20, 2020   (JP) .................................. 2020-027378

(51) Int. Cl.
*C08G 73/06* (2006.01)
*C09D 179/04* (2006.01)
(Continued)

(52) U.S. Cl.
CPC ....... *C08G 73/0672* (2013.01); *C09D 179/04* (2013.01); *G03F 7/11* (2013.01);
(Continued)

(58) Field of Classification Search
CPC ..... C08G 73/0672; C09D 179/04; G03F 7/11; G03F 7/094; G03F 7/20; G03F 7/26;
(Continued)

(56) References Cited

U.S. PATENT DOCUMENTS 8,741,539 B2 *  6/2014  Oh .......................... G03F 7/094
                                                      430/271.1
2008/0118875 A1 *  5/2008  Kim ................... H01L 21/02282
                                                      524/588

(Continued)

FOREIGN PATENT DOCUMENTS

| JP | A-61-239243 A | 10/1986 |
| JP | A-62-025744 A | 2/1987 |
| JP | 2001-051422 A | 2/2001 |
| JP | 2015-091775 A | 5/2015 |

*Primary Examiner* — Caleen O Sullivan
(74) *Attorney, Agent, or Firm* — KNOBBE, MARTENS, OLSON & BEAR LLP

(57) ABSTRACT

A hard-mask forming composition including a resin (P1) having a repeating structure (u1) represented by General Formula (u1-0), wherein $Ar^{01}$ and $Ar^{02}$ are aromatic hydrocarbon groups which may have a substituent, $Ar^{02}$ has at least one nitrogen atom or oxygen atom, $L^{01}$ and $L^{02}$ are each independently a single-bonded or divalent linking group, and X is $NH_4$ and the like

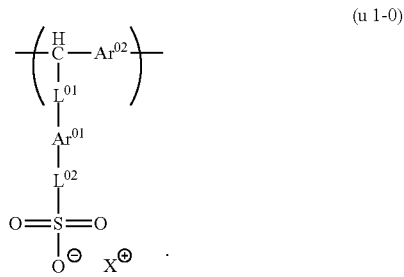

8 Claims, 4 Drawing Sheets

(51) Int. Cl.
    *H01L 21/027*     (2006.01)
    *G03F 7/11*       (2006.01)
    *H01L 21/033*     (2006.01)

(52) U.S. Cl.
    CPC ...... *H01L 21/0274* (2013.01); *H01L 21/0332* (2013.01); *H01L 21/0337* (2013.01)

(58) Field of Classification Search
    CPC ............. H01L 21/0274; H01L 21/0332; H01L 21/0337; C08L 79/04
    USPC ........ 438/703; 430/270.1, 271.1, 272.1, 311, 430/323
    See application file for complete search history.

(56) References Cited

U.S. PATENT DOCUMENTS

| | | | |
|---|---|---|---|
| 2011/0241175 A1* | 10/2011 | Koh | H01L 21/02216 |
| | | | 257/E21.24 |
| 2014/0272722 A1* | 9/2014 | Nakafuji | G03F 7/0384 |
| | | | 528/211 |
| 2016/0011511 A1* | 1/2016 | Shin | C08K 3/30 |
| | | | 430/323 |
| 2016/0018735 A1* | 1/2016 | Tachibana | H01L 21/02271 |
| | | | 430/323 |
| 2020/0041904 A1* | 2/2020 | Tsuchiya | G03F 7/094 |
| 2021/0132498 A1* | 5/2021 | Tsuchiya | G03F 7/11 |

\* cited by examiner

HARD-MASK FORMING COMPOSITION, METHOD FOR MANUFACTURING ELECTRONIC COMPONENT, AND RESIN

BACKGROUND OF THE INVENTION

Field of the Invention

The present invention relates to a hard-mask forming composition, a method for manufacturing an electronic component, and a resin.

Priority is claimed on Japanese Patent Application No. 2020-027378, filed on Feb. 20, 2020, the content of which is incorporated herein by reference.

Description of Related Art

Generally, in semiconductor manufacturing, a laminate in which a resist film is formed on a substrate, such as a silicon wafer, is subjected to processing including dry etching, for example, a treatment in which a resist film is selectively exposed to form a resist pattern on the resist film, and dry etching is performed using thereof as a mask, thereby forming a pattern on the substrate.

As a pattern forming method using a resist film, a three-layer resist method is known (for example, see Japanese Unexamined Patent Application, First Publication No. 2001-51422). The three-layer resist method is that, first, an organic hard mask layer is formed using an organic material on a support, an inorganic hard mask layer is formed thereon using an inorganic material, and then a resist film is further formed on the inorganic hard mask layer. Subsequently, a resist pattern is formed by typical lithography, an inorganic hard mask pattern is formed by etching the inorganic hard mask layer using the resist pattern as a mask, and then an organic hard mask pattern is formed by etching the organic hard mask layer using the inorganic hard mask layer pattern as a mask. Then, the support is processed by being etched using the organic hard mask pattern as a mask.

Additionally, a two-layer resist method with fewer steps than the three-layer resist method has also been proposed (for example, see Japanese Unexamined Patent Application, First Publication Nos. S61-239243 and S62-25744). The two-layer resist method is that the organic hard mask layer is provided on the support in the same manner as in the three-layer resist method, and then the resist film is provided on the organic hard mask layer. Subsequently, the resist pattern is formed by typical lithography, and the organic hard mask pattern is formed by etching the organic hard mask layer using the resist pattern as a mask. Then, the support is processed by being etched using the organic hard mask pattern as a mask.

As a method of forming the organic hard mask layer, a chemical vapor deposition method (hereinafter, sometimes referred to as a CVD method) is known in the related art. The CVD method uses amorphous carbon as a hard-mask forming material and has problems including slow throughput and expensive equipment investment.

Therefore, in recent years, a film forming technique by a spin-on-coating (SOC) method has been introduced (for example, see Japanese Unexamined Patent Application, First Publication No. 2015-91775). An organic hard-mask forming material applicable to the SOC method has been proposed. The SOC method has advantageous effects of high throughput and usability of an existing spin coater as compared with the CVD method.

The hard-mask forming material is required to have high etching resistance and solvent resistance in order to function as a mask for substrate processing. In addition, since the hard-mask forming material is required to withstand a high temperature at the time of forming the inorganic hard mask layer, heat resistance is also required.

Generally, as the organic hard-mask forming material, a composition containing a specific resin containing an aromatic ring, from a viewpoint of etching resistance, a cross-linking agent, from a viewpoint of solvent resistance and heat resistance, and a thermal acid generator for accelerating crosslinking reaction of the crosslinking agent is used.

PRIOR ART DOCUMENT

Patent Literature

[Patent Literature 1] Japanese Unexamined Patent Application, First Publication No. 2001-51422
[Patent Document 2] Japanese Unexamined Patent Application, First Publication No. S61-239243
[Patent Document 3] Japanese Unexamined Patent Application, First Publication No. S62-25744
[Patent Document 4] Japanese Unexamined Patent Application, Publication No. 2015-91775

SUMMARY OF THE INVENTION

However, in a hard-mask forming material containing a thermal acid generator, since the thermal acid generator is low molecular, there is a problem that outgassing is easily generated at a time of baking when processing a support.

In addition, in recent years, as a high aspect ratio of etching processing has been proceeded, the hard-mask forming material is required to have higher etching resistance than before.

The present invention is made in view of the circumstances stated above, and an object of the present invention is to provide a hard-mask forming composition generating small outgassing at the time of baking and having favorable etching resistance and solvent resistance, a method for manufacturing an electronic component using the hard-mask forming composition, and a resin useful for the hard-mask forming composition.

The present invention adopts the following constitution in order to achieve the object.

That is, a first aspect of the present invention is a hard-mask forming composition which forms a hard mask used in lithography, the hard-mask forming composition including: a resin (P1) having a repeating structure (u1) represented by General Formula (u1-0).

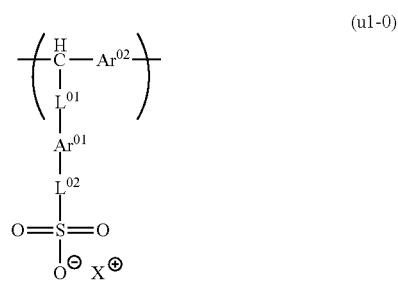

[In the formula, $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. X is a hydrogen atom, $NH_4$, a compound obtained by adding a hydrogen atom to an amine, or a quaternary ammonium].

A second aspect of the present invention is a method for manufacturing an electronic component, the method including: forming a hard mask layer (m1) on a support using the hard-mask forming composition according to the first aspect; and processing the support using the hard mask layer (m1) as a mask.

A third aspect of the present invention is a method for manufacturing an electronic component, the method including: forming a hard mask layer (m1) on a support using the hard-mask forming composition according to the first aspect; forming a hard mask layer (m2) made of an inorganic material on the hard mask layer (m1); forming a resist film on the hard mask layer (m2); forming a resist pattern on the hard mask layer (m2) by exposing the resist film and developing the exposed resist film; etching the hard mask layer (m2) using the resist pattern as a mask to form an inorganic pattern; etching the hard mask layer (m1) using the inorganic pattern as a mask to form a resin pattern; and processing the support using the resin pattern as a mask.

A fourth aspect of the present invention is a method for manufacturing an electronic component, the method including: forming a hard mask layer (m1) on a support using the hard-mask forming composition according to the first aspect; forming an inorganic pattern made of an inorganic material on the hard mask layer (m1); etching the hard mask layer (m1) using the inorganic pattern as a mask to form a resin pattern; and processing the support using the resin pattern as a mask.

A fifth aspect of the present invention is a resin having a repeating structure (u1) represented by General Formula (u1-0).

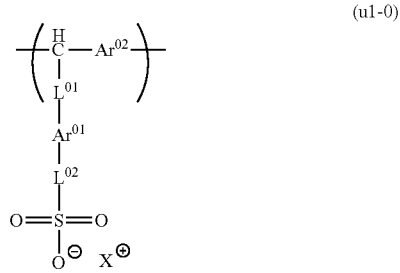
(u1-0)

[In the formula, $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. X is a hydrogen atom, $NH_4$, a compound obtained by adding a hydrogen atom to an amine, or a quaternary ammonium].

According to the present invention, it is possible to provide a hard-mask forming composition generating less outgassing during baking and having favorable etching resistance and solvent resistance, a method for manufacturing an electronic component using the same, and a material useful for the hard-mask forming composition.

DETAILED DESCRIPTION OF THE INVENTION

Figure 1:
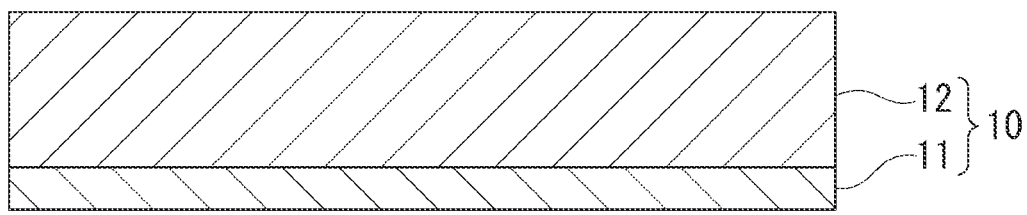
FIG. 1 is a cross-sectional view showing an exemplified support used in a method for manufacturing an electronic component according to an embodiment of the present invention.

In the specification and claims of the present invention, the term "aliphatic" is a relative concept to aromatic, and is defined to mean a group, a compound, or the like, which has no aromaticity.

The term "alkyl group" is intended to encompass linear, branched and cyclic monovalent saturated hydrocarbon groups, unless otherwise specified. The same definition applies to an alkyl group in an alkoxy group.

The term "alkylene group" is intended to encompass linear, branched, and cyclic divalent saturated hydrocarbon groups, unless otherwise specified.

The term "halogenated alkyl group" refers to a group in which a part or all of the hydrogen atoms of the alkyl group are substituted with halogen atoms, and examples of the halogen atom include a fluorine atom, a chlorine atom, a bromine atom, and an iodine atom.

The term "fluorinated alkyl group" or "fluorinated alkylene group" refers to a group in which a part or all of hydrogen atoms of an alkyl group or an alkylene group are substituted with fluorine atoms.

The term "structural unit" refers to a monomer unit (monomer unit) constituting a polymer compound (resin, polymer, or copolymer).

The expression "may have a substituent" or a case where "may have a substituent" is described includes both cases where a hydrogen atom (—H) is substituted with a monovalent group, and where a methylene group (—CH$_2$—) is substituted with a divalent group.

The term "exposure" is a concept that includes general radiation irradiation.

In the specification and claims of the present invention, some structures represented by a chemical formula have an asymmetric carbon, and there may be enantiomers and diastereomers. Those isomers are collectively represented by one formula. The isomers may be used alone, or may be used as a mixture.

In the present specification, the "Ohnishi parameter" means a value obtained by "[the total number of atoms of C, H, and O]/[the number of atoms of C]-[the number of atoms of O])", which is generally an index of the etching resistance of resin (J. Electrochem Soc, 143, 130 (1983), H. Gokan, S. Esho and Y. Ohnishi). The Ohnishi parameter is a parameter generally used to express a carbon density, and the lower the Ohnishi parameter, the better the etching resistance.

(Hard-Mask Forming Composition)

The hard-mask forming composition according to the first aspect of the present invention is a composition for forming a hard mask used in lithography.

The hard-mask forming composition of the present embodiment contains a resin (P1) having a repeating structure (u1) represented by General Formula (u1-0). The repeating structure (u1) is characterized in that the side chain contains a site that acts as an acid by heating.

<Resin (P1)>

The resin (P1) is a resin having a repeating structure (u1) represented by General Formula (u1-0).

<<Repeating Structure (u1)>>

The repeating structure (u1) is a repeating structure represented by General Formula (u1-0).

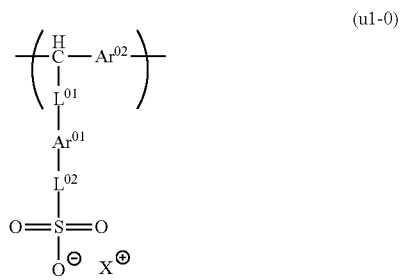

(u1-0)

[In the formula, $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. X is a hydrogen atom, $NH_4$, a compound obtained by adding a hydrogen atom to an amine, or a quaternary ammonium].

In Formula (u1-0), $Ar^{01}$ is an aromatic hydrocarbon group which may have a substituent. Examples of the substituent include a hydroxy group, a carbonyl group, an alkoxy group, a halogen atom, an alkyl group, an alkenyl group, an alkynyl group, and the like.

The aromatic hydrocarbon group for $Ar^{01}$ has preferably 6 to 30 carbon atoms, and more preferably 6 to 25 carbon atoms. The aromatic hydrocarbon group for $Ar^{01}$ is a hydrocarbon group which has at least one aromatic ring. The aromatic ring is not particularly limited as long as it is a cyclic conjugated system having $4n+2$ π electrons, and may be monocyclic or polycyclic. The aromatic ring has preferably 5 to 20 carbon atoms, more preferably 5 to 18 carbon atoms, and further more preferably 6 to 16 carbon atoms.

Specific examples of the aromatic ring include an aromatic hydrocarbon ring such as benzene, naphthalene, anthracene, phenanthrene, pyrene, or the like; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom, and the like. Specific examples of the aromatic heterocyclic ring include a pyrrolidine ring, a pyridine ring, a thiophene ring, and the like.

Specific examples of the aromatic hydrocarbon group for $Ar^{01}$ include a group (an arylene group) obtained by removing two hydrogen atoms from the aromatic hydrocarbon ring; a group in which one hydrogen atom of a group (aryl group) obtained by removing one hydrogen atom from the aromatic hydrocarbon ring is substituted with an alkylene group (for example, a group obtained by further removing one hydrogen atom from an aryl group in an arylalkyl group such as benzyl group, phenethyl group, 1-naphthylmethyl group, 2-naphthylmethyl group, 1-naphthylethyl group, 2-naphthylethyl group, and the like); and the like. The alkylene group (alkyl chain in the arylalkyl group) preferably has 1 to 4 carbon atoms, more preferably 1 to 2 carbon atoms, and particularly preferably 1 carbon atom.

Among these, $Ar^{01}$ in Formula (u1-0) is preferably a phenylene group (a group obtained by removing two hydrogen atoms from the benzene ring).

In Formula (u1-0), $L^{01}$ and $L^{02}$ are each independently a single-bonded or divalent linking group. The divalent linking group for $L^{01}$ and $L^{02}$ is not particularly limited, but preferable examples include a divalent hydrocarbon group which may have a substituent, a divalent linking group containing a hetero atom, and the like.

A Divalent Hydrocarbon Group which May have a Substituent:

In a case where $L^{01}$ or $L^{02}$ is a divalent hydrocarbon group which may have a substituent, the hydrocarbon group may be an aliphatic hydrocarbon group or may be an aromatic hydrocarbon group.

Aliphatic Hydrocarbon Groups for $L^{01}$ and $L^{02}$

An aliphatic hydrocarbon group means a hydrocarbon group that do not have aromaticity. The aliphatic hydrocarbon group may be saturated or unsaturated, and is usually preferably saturated. Examples of the aliphatic hydrocarbon group include a linear or branched aliphatic hydrocarbon group, an aliphatic hydrocarbon group containing a ring in the structure, or the like.

Linear or Branched Aliphatic Hydrocarbon Group

The linear aliphatic hydrocarbon group preferably has 1 to 10 carbon atoms, more preferably 1 to 6 carbon atoms, further more preferably 1 to 4 carbon atoms, and most preferably 1 to 3 carbon atoms.

The linear aliphatic hydrocarbon group is preferably a linear alkylene group, and specific examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

The branched aliphatic hydrocarbon group preferably has 2 to 10 carbon atoms, more preferably 3 to 6 carbon atoms, further more preferably 3 or 4 carbon atoms, and most preferably 3 carbon atoms.

The branched aliphatic hydrocarbon group is preferably a branched alkylene group, and specific examples thereof include an alkylalkylene group encompassing an alkylmethylene group such as —$CH(CH_3)$—, —$CH(CH_2CH_3)$—, —$C(CH_3)_2$—, —$C(CH_3)(CH_2CH_3)$—, —$C(CH_3)$ —(CH$_2$CH$_2$CH$_3$)—, —C(CH$_2$CH$_3$)$_2$— or the like; an alkylethylene group such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, —C(CH$_2$CH$_3$)$_2$—CH$_2$— or the like; an alkyltrimethylene group such as —CH(CH$_3$)CH$_2$CH$_2$—, —CH$_2$CH(CH$_3$)CH$_2$— or the like; an alkyltetramethylene group such as —CH(CH$_3$)CH$_2$CH$_2$CH$_2$—, —CH$_2$CH(CH$_3$)CH$_2$CH$_2$— or the like; and the like. As the alkyl group in the alkylalkylene group, a linear alkyl group having 1 to 5 carbon atoms is preferable.

The linear or branched aliphatic hydrocarbon group may have a substituent, or may not have a substituent. Examples of the substituent include a fluorine atom, a fluorinated alkyl group having 1 to 5 carbon atoms substituted with a fluorine atom, a carbonyl group, and the like.

Aliphatic Hydrocarbon Group Containing a Ring in the Structure

Examples of the aliphatic hydrocarbon group containing a ring in the structure include a cyclic aliphatic hydrocarbon group which may contain a substituent containing a hetero atom in the ring structure (group obtained by removing two hydrogen atoms from the aliphatic hydrocarbon ring), a group in which the cyclic aliphatic hydrocarbon group is bonded to the terminal of a linear or branched aliphatic hydrocarbon group, a group in which the cyclic aliphatic hydrocarbon group intervenes in the middle of a linear or branched aliphatic hydrocarbon group, and the like. Examples of the linear or branched aliphatic hydrocarbon group include the same groups as stated above.

The cyclic aliphatic hydrocarbon group has preferably 3 to 20 carbon atoms, and more preferably 3 to 12 carbon atoms.

The cyclic aliphatic hydrocarbon group may be a polycyclic group, or may be a monocyclic group. As the monocyclic alicyclic hydrocarbon group, a group obtained by removing two hydrogen atoms from a monocycloalkane is preferable. As the monocycloalkane, those having 3 to 6 carbon atoms are preferable, and specific examples thereof include cyclopentane, cyclohexane, and the like. The polycyclic aliphatic hydrocarbon group is preferably a group obtained by removing two hydrogen atoms from a polycycloalkane, the polycycloalkane is preferably one having 7 to 12 carbon atoms, and specific examples thereof include adamantane, norbornane, isobornane, tricyclodecane, tetracyclododecane, and the like.

The cyclic aliphatic hydrocarbon group may have a substituent, or may not have a substituent. Examples of the substituent include an alkyl group, an alkoxy group, a halogen atom, a halogenated alkyl group, a hydroxyl group, a carbonyl group, and the like.

The alkyl group as the substituent is preferably an alkyl group having 1 to 5 carbon atoms, and is more preferably a methyl group, an ethyl group, a propyl group, an n-butyl group, and a tert-butyl group.

The alkoxy group as the substituent is preferably an alkoxy group having 1 to 5 carbon atoms, more preferably a methoxy group, an ethoxy group, an n-propoxy group, an iso-propoxy group, an n-butoxy group, and a tert-butoxy group, and further more preferably a methoxy group and an ethoxy group.

Examples of the halogen atom as the substituent include a fluorine atom, a chlorine atom, a bromine atom, an iodine atom, and the like, and the fluorine atom is preferable.

Examples of the halogenated alkyl group as the substituent include a group in which a part or all of the hydrogen atoms of the alkyl group is substituted with the halogen atom.

The cyclic aliphatic hydrocarbon group may be substituted with a substituent in which a part of the carbon atom constituting the ring structure contains a hetero atom. The substituent containing a hetero atom is preferably —O—, —C(=O)—O—, —S—, —S(=O)$_2$—, and —S(=O)$_2$—O—.

Aromatic Hydrocarbon Group for $L^{01}$ and $L^{02}$

The aromatic hydrocarbon group is a hydrocarbon group having at least one aromatic ring.

The aromatic ring is not particularly limited as long as the aromatic ring is a cyclic conjugated system having $4n+2\pi$ electrons, and may be monocyclic or polycyclic. The aromatic ring has preferably 5 to 30 carbon atoms, more preferably 5 to 20 carbon atoms, further more preferably 6 to 15 carbon atoms, and particularly preferably 6 to 12 carbon atoms. However, the number of carbon atoms does not include the number of carbon atoms of the substituent.

Specific examples of the aromatic ring include an aromatic hydrocarbon ring such as benzene, naphthalene, anthracene, and phenanthrene; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom, and the like. Specific examples of the aromatic heterocyclic ring include a pyridine ring, a thiophene ring, and the like.

Specific examples of the aromatic hydrocarbon group include a group (an arylene group or a heteroarylene group) obtained by removing two hydrogen atoms from the aromatic hydrocarbon ring or the aromatic heterocyclic ring; a group obtained by removing two hydrogen atoms from an aromatic compound (for example, biphenyl, fluorene, and the like) containing two or more aromatic rings; a group (for example, a group obtained by further removing one hydrogen atom from an aryl group in an arylalkyl group such as benzyl group, phenethyl group, 1-naphthylmethyl group, 2-naphthylmethyl group, 1-naphthylethyl group, 2-naphthylethyl group, and the like) in which one of hydrogen atoms of the group (aryl group or heteroaryl group) obtained by removing one hydrogen atom from the aromatic hydrocarbon ring or the aromatic heterocyclic ring is substituted with an alkylene group; and the like. The aryl group or the alkylene group to be bonded to a heteroaryl group has preferably 1 to 4 carbon atoms, more preferably 1 to 2 carbon atoms, and particularly preferably 1 carbon atom.

In the aromatic hydrocarbon group, the hydrogen atom contained in the aromatic hydrocarbon group may be substituted with a substituent. For example, the hydrogen atom bonded to the aromatic ring in the aromatic hydrocarbon group may be substituted with a substituent. Examples of the substituent include an alkyl group, an alkoxy group, a halogen atom, a halogenated alkyl group, a hydroxyl group, and the like.

The alkyl group as the substituent is preferably an alkyl group having 1 to 5 carbon atoms, and is more preferably a methyl group, an ethyl group, a propyl group, an n-butyl group, and a tert-butyl group.

Examples of the alkoxy group, the halogen atom, and the halogenated alkyl group as the substituent include those exemplified as the substituent for substituting the hydrogen atom of the cyclic aliphatic hydrocarbon group.

Divalent Linking Group Containing Hetero Atom:

In a case where $L^{01}$ or $L^{02}$ is a divalent linking group containing a hetero atom, preferable examples of the linking group include a group represented by —O—, —C(=O)—O—, —O—C(=O)—, —C(=O)—, —O—C(=O)—O—, —C(=O)—NH—, —NH—, —NH—C(=NH)—(H may be substituted with a substituent such as alkyl group and acyl group), —S—, —S(=O)$_2$—, —S(=O)$_2$—O—, -General Formula-Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— [in the formula, Y$^{21}$ and Y$^{22}$ are each independently a divalent hydrocarbon group which may have a substituent, O is an oxygen atom, and m" is an integer of 0 to 3], and the like.

In a case where the divalent linking group containing the hetero atom is —C(=O)—NH—, —C(=O)—NH—C(=O)—, —NH—, and —NH—C(=NH)—, H may be substituted with a substituent such as an alkyl group or an acyl. The substituent (alkyl group, acyl group, and the like) has preferably 1 to 10 carbon atoms, more preferably 1 to 8 carbon atoms, and particularly preferably 1 to 5 carbon atoms.

Among General Formula-Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ are each independently a divalent hydrocarbon group which may have a substituent. Examples of the divalent hydrocarbon group is the same as that described in the description as the divalent linking group for L$^{01}$ and L$^{02}$ (the divalent hydrocarbon group which may have a substituent).

As Y$^{21}$, a linear aliphatic hydrocarbon group is preferable, a linear alkylene group is more preferable, a linear alkylene group having 1 to 5 carbon atoms is further more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In a group represented by Formula-[Y$^{21}$—C(=O)—O]$_{m''}$—Y$^{22}$—, m" is an integer of 0 to 3, preferably an integer of 0 to 2, more preferably an integer of 0 or 1, and particularly preferably an integer of 1. In other words, as the group represented by Formula-[Y$^{21}$—C(=O)—O]$_{m''}$—Y$^{22}$—, a group represented by Formula-Y$^{21}$—C(=O)—O—Y$^{22}$— is particularly preferable. Among these, a group represented by Formula-(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, further preferably an integer of 1 or 2, and most preferably an integer of 1. b' is an integer of 1 to 10, preferably an integer of 1 to 8, more preferably an integer of 1 to 5, further more preferably an integer of 1 or 2, and most preferably an integer of 1.

Among these, L$^{01}$ and L$^{02}$ are each independently preferably a single bond, an ester bond [—C(=O)—O—, —O—C(=O)—], an ether bond (—O—), a linear or branched alkylene group, or a combination thereof, and it is more preferable that both of L$^{01}$ and L$^{02}$ are single bonds.

In Formula (u1-0), Ar$^{02}$ is an aromatic hydrocarbon group which may have a substituent.

Examples of the aromatic hydrocarbon group which may have a substituent include the same as Ar$^{01}$ stated above.

Ar$^{02}$ has at least one nitrogen atom or oxygen atom. Here, examples of the case where Ar$^{02}$ has at least one nitrogen atom or oxygen atom include a case where an aromatic hydrocarbon group for Ar$^{02}$ is a group having an aromatic heterocyclic ring such as a furan ring, a pyrrole ring, and a pyridine ring, or a case where an aromatic hydrocarbon group for Ar$^{02}$ has a substituent having at least one nitrogen atom or oxygen atom such as a hydroxyl group, an alkoxy group, a carbonyl group, an amino group, an imino group, and a group having the aromatic heterocyclic ring.

Among these, Ar$^{02}$ in Formula (u1-0) is preferably a group having a pyrrole ring or an aromatic hydrocarbon group having a hydroxyl group. The aromatic hydrocarbon in the aromatic hydrocarbon group having a hydroxyl group is preferably benzene, naphthalene, anthracene, phenanthrene, or pyrene, and more preferably naphthalene or pyrene.

Specific examples of Ar$^{02}$ in Formula (u1-0) are shown below. * indicates a bond.

(Ar$^{02}$-1)

(Ar$^{02}$-2)

(Ar$^{02}$-3)

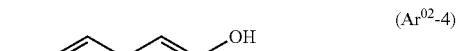

(Ar$^{02}$-4)

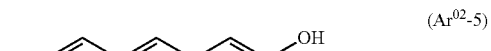

(Ar$^{02}$-5)

(Ar$^{02}$-6)

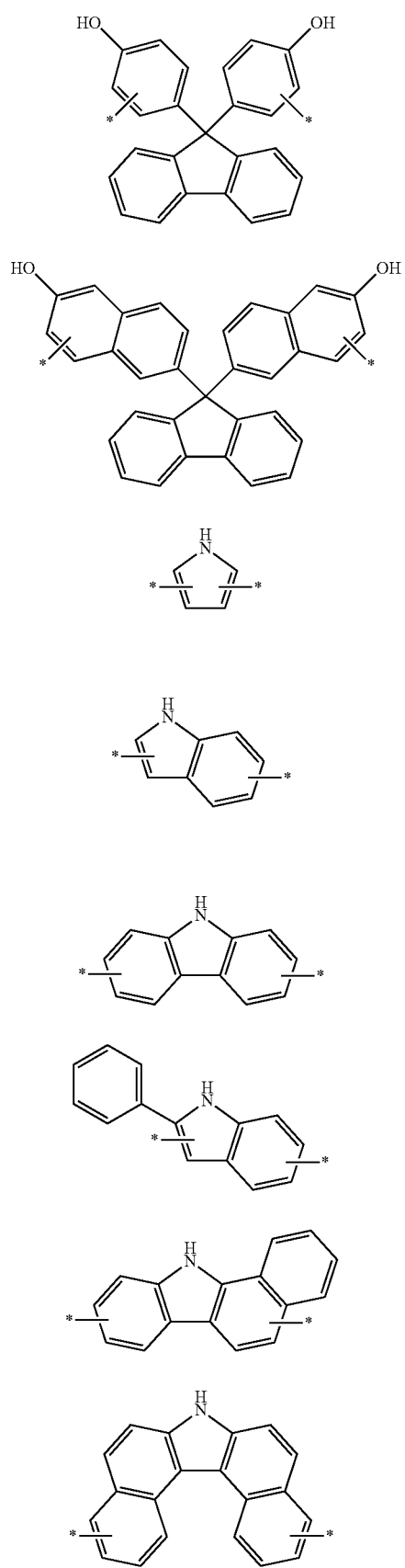

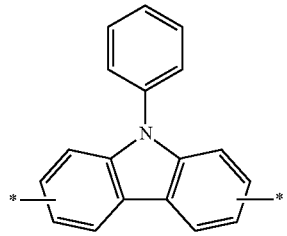

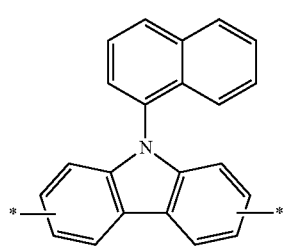

In Formula (u1-0), X is a hydrogen atom, $NH_4$, a compound obtained by adding a hydrogen atom to an amine, or a quaternary ammonium.

Amine

Examples of the amine in the compound obtained by adding a hydrogen atom to an amine include an aliphatic amine, a hybrid amine, an aromatic amine, a heterocyclic amine, a nitrogen-containing compound having a carboxy group, a nitrogen-containing compound having a sulfonyl group, a nitrogen-containing compound having a hydroxyl group, an amide derivative, an imide derivative, and the like.

Examples of the aliphatic amine include an aliphatic primary amine, an aliphatic secondary amine, and an aliphatic tertiary amine.

Specific examples of the aliphatic primary amine include methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like.

Specific examples of the aliphatic secondary amine include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N, N-dimethylmethylenediamine, N,N-dimethylethylenediamine, N, N-dimethyltetraethylenepentamine, and the like.

Specific examples of the aliphatic tertiary amine include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N, N, N', N'-tetramethylmethylenediamine, N, N, N', N'-tetramethylethylenediamine, N, N, N', N'-tetramethyltetraethylenepentamine, and the like.

Specific examples of the hybrid amine include dimethylethylamine, methylethylpropylamine, benzylamine, phenethylamine, benzyldimethylamine, and the like.

Specific examples of the aromatic amine and the heterocyclic amine include an aniline derivative (for example, aniline, N-methylaniline, N-ethylaniline, N-propylaniline, N, N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N, N-dimethyltoluidine, and the like), diphenyl (p-tolyl) amine, methyldiphenylamine, triphenylamine, phenylenediamine, naphthylamine, diaminonaphthalene, pyrrole derivative (for example, pyrrole, 2H-pyrrole, 1-methylpyrrole, 2,4-dimethylpyrrole, 2,5-dimethylpyrrole, N-methylpyrrole, and the like), oxazole derivative (for example, oxazole, isooxazole, and the like), thiazole derivative (for example, thiazole, isothiazole, and the like), imidazole derivative (for example, imidazole, 4-methylimidazole, 4-methyl-2-phenylimidazole, and the like), pyrazole derivative, furazane derivative, pyrroline derivative (for example, pyrroline, 2-methyl-1-pyrroline, and the like), pyrrolidine derivative (for example, pyrrolidine, N-methylpyrrolidine, pyrrolidinone, N-methylpyrrolidone, and the like), imidazoline derivative, imidazolidine derivative, pyridine derivative (for example, pyridine, methylpyridine, ethylpyridine, propylpyridine, butylpyridine, 4-(1-butylpentyl) pyridine, 2, 6-dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl) pyridine, aminopyridine, dimethylaminopyridine, and the like), pyridazine derivative, pyrimidine derivative, pyrazine derivative, pyrazoline derivative, pyrazolidine derivative, piperidine derivative, piperazine derivative, morpholine derivative, indole derivative, isoindole derivative, 1H-indazole derivative, indoline derivative, quinoline derivative (for example, quinoline, 3-quinoline carbonitrile, and the like), isoquinoline derivative, cinnoline derivative, quinazoline derivative, quinoxaline derivative, phthalazine derivative, purine derivative, pteridine derivative, carbazole derivative, phenanthridine derivative, acridine derivative, phenazine derivative, 1,10-phenanthroline derivative, adenine derivative, adenosine derivative, guanine derivative, guanosine derivative, uracil derivative, uridine derivative, and the like.

Specific examples of the nitrogen-containing compound having a carboxy group include aminobenzoic acid, indolecarboxylic acid, amino acid derivative (for example, nicotinic acid, alanine, arginine, aspartic acid, glutamate, glycine, histidine, isoleucine, glycylleucine, leucine, methionine, phenylalanine, threonine, lysine, 3-aminopyrazine-2-carboxylic acid, methoxyalanine), and the like.

Specific examples of the nitrogen-containing compound having a sulfonyl group include 3-pyridinesulfonic acid, pyridinium p-toluenesulfonate, and the like.

Specific examples of the nitrogen-containing compound having a hydroxyl group include 2-hydroxypyridine, aminocresol, 2,4-quinolinediol, 3-indolemethanolhydrate, monoethanolamine, diethanolamine, triethanolamine, N-ethyldiethanolamine, N, N-diethylethanolamine, triisopropanolamine, 2,2'-iminodiethanol, 2-aminoethanol, 3-amino-1-propanol, 4-amino-1-butanol, 4-(2-hydroxyethyl) morpholine, 2-(2-hydroxyethyl) pyridine, 1-(2-hydroxyethyl) piperazine, 1-[2-(2-hydroxyethoxy) ethyl] piperazine, piperidine ethanol, 1-(2-hydroxyethyl) pyrrolidine, 1-(2-hydroxyethyl)-2-pyrrolidinone, 3-piperidino-1,2-propanediol, 3-pyrrolidino-1,2-propanediol, 8-hydroxyeurolidine, 3-quinuclidinol, 3-tropanol, 1-methyl-2-pyrrolidine ethanol, 1-aziridine ethanol, N-(2-hydroxyethyl) phthalimide, N-(2-hydroxyethyl) isonicotinamide, and the like.

Specific examples of the amide derivative include formamide, N-methylformamide, N, N-dimethylformamide, acetamide, N-methylacetamide, N, N-dimethylacetamide, propionamide, and benzamide, and the like.

Specific examples of the imide derivative include phthalimide, succinimide, maleimide, and the like.

Quaternary Ammonium

Examples of the quaternary ammonium include tetraalkylammonium and the like. The alkyl group in the tetraalkylammonium is preferably an alkyl group having 1 to 5 carbon atoms, and more preferably an alkyl group having 1 to 3 carbon atoms.

Preferable specific examples of the quaternary ammonium include tetramethylammonium, tetraethylammonium, and the like.

Among these, in Formula (u1-0), X is preferably $NH_4$ or a compound obtained by adding a hydrogen atom to an amine.

The compound obtained by adding a hydrogen atom to an amine is preferably a compound obtained by adding a hydrogen atom to an aromatic amine, more preferably a compound obtained by adding a hydrogen atom to a pyridine derivative, and further more preferably a compound obtained by adding a hydrogen atom to 2,6-dimethyl pyridine.

Among these, the repeating structure (u1) is more preferably a repeating structure (u11) represented by General Formula (u1-1), a repeating structure (u12) represented by General Formula (u1-2), or a repeating structure (u13) represented by General Formula (u1-3).

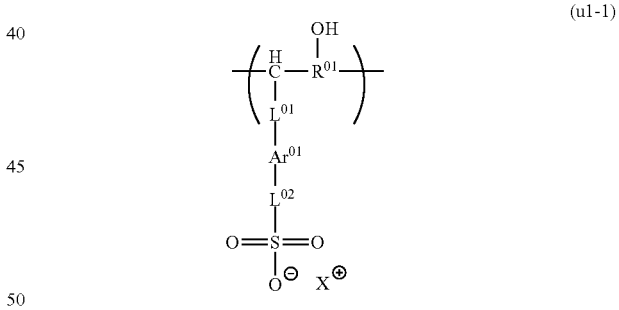

(u1-1)

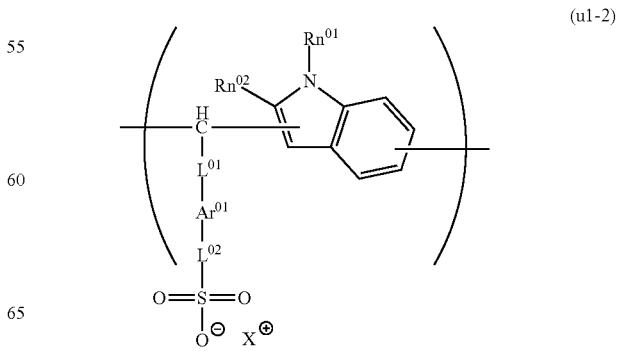

(u1-2)

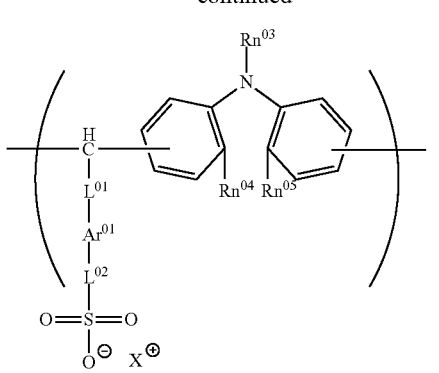

(u1-3)

[Among Formulae (u1-1) to (u1-3), $Ar^{01}$ is each independently an aromatic hydrocarbon group which may have a substituent. $L^{01}$ and $L^{02}$ are each independently a single-bonded or divalent linking group. X is each independently a hydrogen atom, $NH_4$, a compound obtained by adding a hydrogen atom to an amine compound, or a quaternary ammonium.

In Formula (u1-1), $R^{01}$ is an aromatic hydrocarbon group which may have a substituent.

In Formula (u1-2), and $Rn^{02}$ are each independently a monovalent hydrocarbon group or a hydrogen atom.

In Formula (u1-3), $Rn^{03}$ to $Rn^{05}$ are each independently a monovalent hydrocarbon group or a hydrogen atom. $Rn^{04}$ and $Rn^{05}$ may be bonded to each other to form a condensed ring with the nitrogen atom in the formula.]

In Formulae (u1-1) to (u1-3), $Ar^{01}$, $L^{01}$, $L^{02}$, and X are the same as $Ar^{01}$, $L^{01}$, $L^{02}$, and X in Formula (u1-0) stated above, respectively.

In Formula (u1-1), $R^{01}$ is an aromatic hydrocarbon group which may have a substituent. Examples of the aromatic hydrocarbon group which may have a substituent include the same as the aromatic hydrocarbon group which may have a substituent for $Ar^{02}$ of Formula (u1-0) stated above.

The aromatic hydrocarbon in the aromatic hydrocarbon group for $R^{01}$ is preferably benzene, naphthalene, anthracene, phenanthrene, or pyrene, and more preferably naphthalene or pyrene.

In Formula (u1-2), $Rn^{01}$ and $Rn^{02}$ are each independently a monovalent hydrocarbon group or a hydrogen atom.

Examples of the monovalent hydrocarbon group for $Rn^{01}$ and $Rn^{02}$ include a chain hydrocarbon group or a cyclic hydrocarbon group, or a hydrocarbon group combining a chain and a ring.

Examples of the chain hydrocarbon group include a linear alkyl group and a branched alkyl group. As the linear alkyl group, a methyl group, an ethyl group, a propyl group, a butyl group, and a pentyl group are preferable, and a methyl group is preferable.

Examples of the branched alkyl group include 1-methylethyl group, 1-methylpropyl group, 2-methylpropyl group, 1-methylbutyl group, 2-methylbutyl group, 3-methylbutyl group, 1-ethylbutyl group, 2-ethylbutyl group, 1-methylpentyl group, 2-methylpentyl group, 3-methylpentyl group, 4-methylpentyl group, and the like.

The cyclic hydrocarbon group may be an alicyclic hydrocarbon group, or may be an aromatic hydrocarbon group.

The alicyclic hydrocarbon group may be either monocyclic or polycyclic.

Examples of the monocyclic alicyclic hydrocarbon group include cycloalkyl groups such as a cyclopropyl group, a cyclobutyl group, a cyclopentyl group, a cyclohexyl group, a methylcyclohexyl group, a dimethylcyclohexyl group, a cycloheptyl group, a cyclooctyl group, a cyclononyl group, and a cyclodecyl group.

Examples of the polycyclic alicyclic hydrocarbon group include a decahydronaphthyl group, an adamantyl group, a 2-alkyladamantane-2-yl group, a 1-(adamantane-1-yl)alkane-1-yl group, a norbornyl group, a methylnorbornyl group, an isobornyl group, and the like.

Examples of the aromatic hydrocarbon group include a phenyl group, a naphthyl group, an anthryl group, a p-methylphenyl group, a p-tert-butylphenyl group, a p-adamantylphenyl group, a tolyl group, a xylyl group, a cumenyl group, a mesityl group, a biphenyl group, a phenanthryl group, a 2,6-diethylphenyl group, a 2-methyl-6-ethylphenyl group, and the like.

Among these, in Formula (u1-2), $Rn^m$ is preferably a hydrogen atom or a linear alkyl group having 1 to 5 carbon atoms, more preferably a hydrogen atom or a methyl group, and further more preferably a hydrogen atom.

Among these, in Formula (u1-2), $Rn^{02}$ is preferably a hydrogen atom or an aromatic hydrocarbon group, and more preferably a hydrogen atom or a phenyl group.

In Formula (u1-3), $Rn^{03}$ to $Rn^{05}$ are each independently a monovalent hydrocarbon group or a hydrogen atom. Examples of the monovalent hydrocarbon group include the same as a monovalent hydrocarbon group for $Rn^m$ and $Rn^{02}$ in Formula (u1-2).

In Formula (u1-3), $Rn^{04}$ and $R^{05}$ may be bonded to each other to form a condensed ring together with a nitrogen atom in the formula. The condensed ring is preferably a carbazole ring.

A specific example of the repeating structure (u11) is shown below.

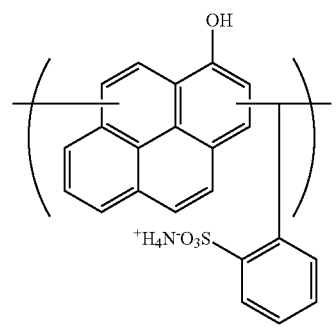

(u11-1)

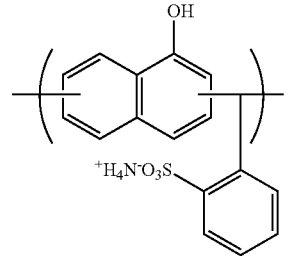

(u11-2)

A specific example of the repeating structure (u12) is shown below.

(u12-1)

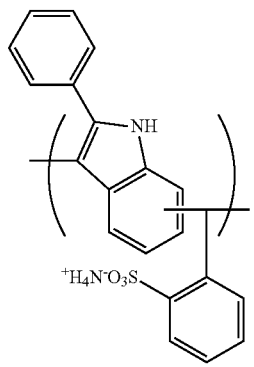

(u12-2)

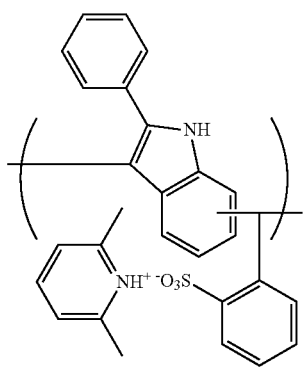

A specific example of the repeating structure (u13) is shown below.

(u13-1)

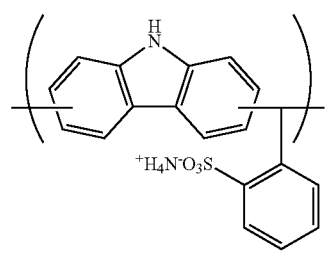

<<Repeating Structure (u2)>>

It is preferable that the resin (P1) further has one or more repeating structures (u2) selected from a repeating structure (u21) represented by General Formula (u2-1), a repeating structure (u22) represented by General Formula (u2-2), and a repeating structure (u23) represented by General Formula (u2-3).

(u2-1)

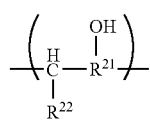

(u2-2)

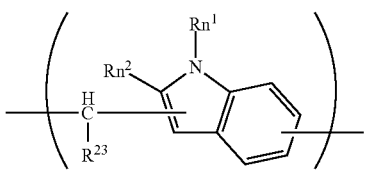

(u2-3)

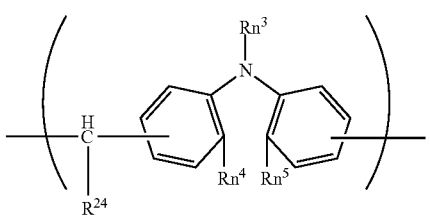

[In Formulae (u2-1) to (u2-3), $R^{22}$, $R^{23}$, and $R^{24}$ are each independently an aromatic hydrocarbon group or a hydrogen atom which may have a substituent.

In Formula (u2-1), $R^{21}$ is an aromatic hydrocarbon group which may have a substituent.

In Formula (u2-2), $Rn^1$ and $Rn^2$ are each independently a monovalent hydrocarbon group or a hydrogen atom.

In Formula (u2-3), $Rn^3$ to $Rn^5$ are each independently a monovalent hydrocarbon group or a hydrogen atom. $Rn^4$ and $Rn^5$ may be bonded to each other to form a condensed ring with a nitrogen atom in the formula.]

In Formulae (u2-1) to (u2-3), $R^{22}$, $R^{23}$, and $R^{24}$ are each independently an aromatic hydrocarbon group or a hydrogen atom which may have a substituent. Examples of the aromatic hydrocarbon group which may have a substituent include the same as $Ar^{01}$ in Formula (u1-0) stated above.

In Formula (u2-1), $R^{21}$ is an aromatic hydrocarbon group which may have a substituent. Examples of the aromatic hydrocarbon group which may have a substituent include the same as $Ar^{02}$ in Formula (u1-0) stated above.

In Formula (u2-2), $Rn^1$ and $Rn^2$ are each independently a monovalent hydrocarbon group or a hydrogen atom. Examples of $Rn^1$ and $Rn^2$ include the same as $Rn^{01}$ and $Rn^{02}$ in Formula (u1-2).

In Formula (u2-3), $Rn^3$ to $Rn^5$ are each independently a monovalent hydrocarbon group or a hydrogen atom. Examples of $Rn^3$ to $Rn^5$ include the same as $Rn^{03}$ to $Rn^{05}$ in Formula (u1-3). $Rn^4$ and $Rn^5$ may be bonded to each other to form a condensed ring with a nitrogen atom in the formula.

Preferable specific examples of the resin (P1) are shown below.

(P1-1)

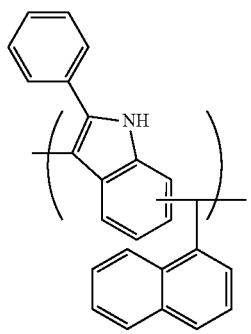 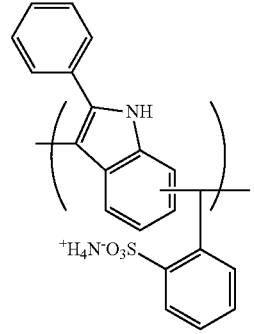

(P1-2) 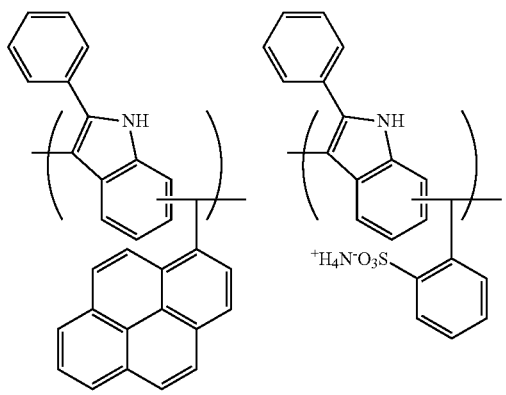
(P1-3) 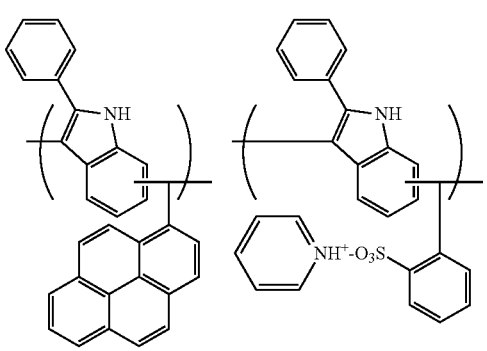
(P1-4) 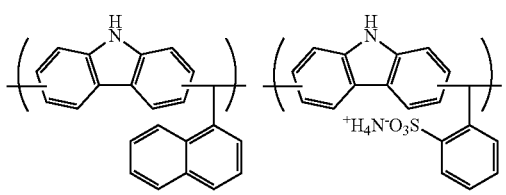
(P1-5) 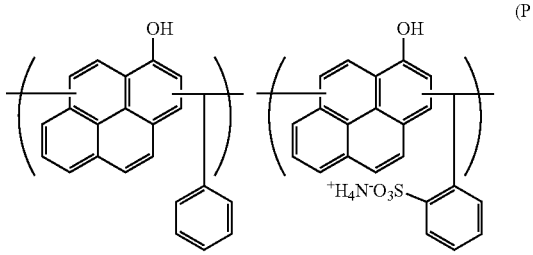
(P1-6) 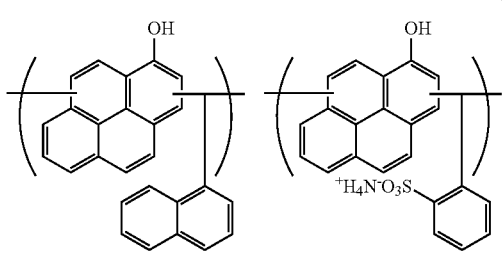
(P1-7) 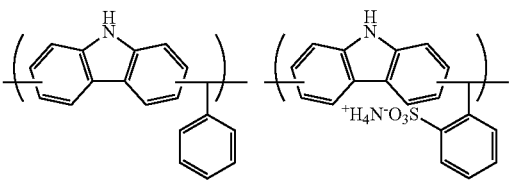
(P1-8) 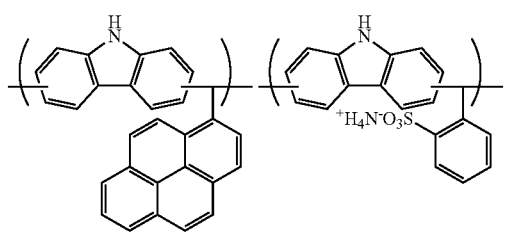
(P1-9) 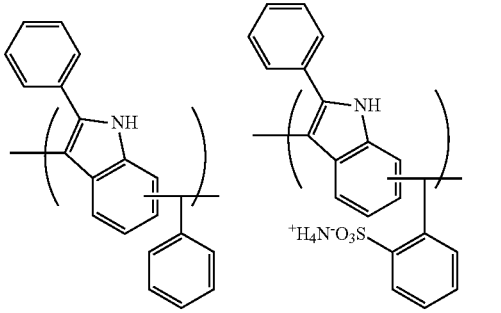
(P1-10) 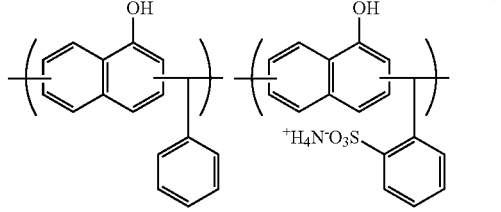
(P1-11) 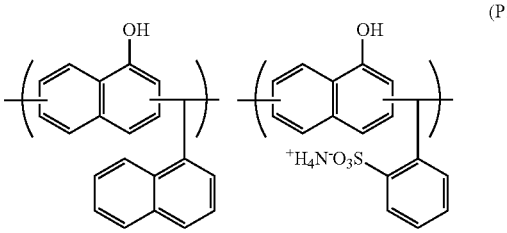
(P1-12) 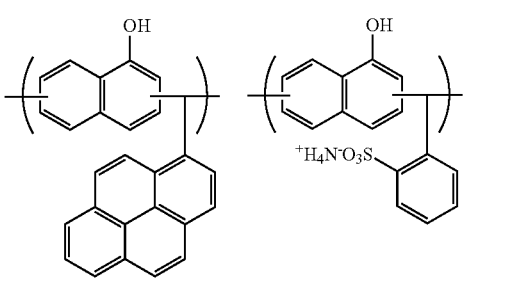

-continued (P1-13)

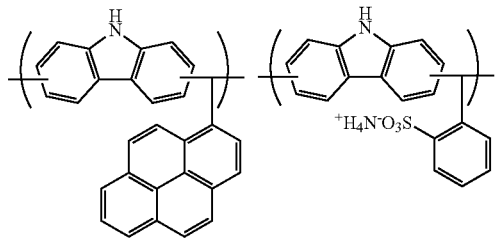

Among these, the resin (P1) is preferably a resin represented by Formulae (P1-1) to (P1-6).

A molar ratio of the repeating structure (u1) to the repeating structure (u2) in the resin (P1) (mole of the repeating structure (u1):mole of the repeating structure (u2)) is preferably 0.5:99.5 to 10:90, more preferably 1:99 to 7:93, and further more preferably 2:98 to 4:96.

In a case where the ratio of the repeating structure (u1) is equal to or higher than the lower limit value, the crosslinking reaction proceeds sufficiently, and the solvent resistance of the hard mask layer formed by the hard-mask forming composition containing the resin (P1) is further improved. On the other hand, in a case where the ratio of the repeating structure (u1) is equal to or less than the upper limit value, the solvent solubility of the resin (P1) is further improved.

A weight average molecular weight (Mw) (based on polystyrene conversion by gel permeation chromatography (GPC)) of the resin (P1) is not particularly limited, and is preferably about 1,000 to 500,000, and more preferably about 2,000 to 10,000. In a case where Mw of the resin (P1) is within the preferable range, etching resistance and heat resistance are preferable.

A polydispersity (Mw/Mn) of the resin (P1) is not particularly limited, and is preferably about 1.0 to 4.0, more preferably about 1.0 to 3.0, and particularly preferably about 1.0 to 2.5. Mn represents a number average molecular weight.

<<Optional Components>>

The hard-mask forming composition of the present embodiment may contain other optional components in addition to the resin (P1) stated above. Examples of the optional component include a crosslinking agent, a surfactant, a solvent, and the like. In addition, a thermal acid generator, a crosslinking acceleration catalyst, a photoacid generator, an absorbent, a rheology modifier, and an adhesion aider may be contained within a range not impairing the effects of the present invention.

Crosslinking Agent

The hard-mask forming composition of the present embodiment preferably further contains a crosslinking agent.

Examples of the crosslinking agent include an amino-based crosslinking agent such as glycoluril having a methylol group or an alkoxymethyl group; a melamine-based crosslinking agent; and the like. Specific examples thereof include Nikalac [registered trademark] series (Nikalac MX270 and the like) manufactured by Sanwa Chemical Co., Ltd.

A blending amount of the crosslinking agent component is preferably 1 to 50 parts by mass, and more preferably 1 to 40 parts by mass, based on 100 parts by mass of all resin components in the hard-mask forming composition. The crosslinking agent may be used alone, or two or more types thereof may be used in combination.

Surfactant

The hard-mask forming composition of the present embodiment preferably further contains a surfactant.

Examples of the surfactant include a non-ionic surfactant encompassing: polyoxyethylene alkyl ethers such as polyoxyethylene lauryl ether, polyoxyethylene stearyl ether, polyoxyethylene cetyl ether, polyoxyethylene oleyl ether or the like; polyoxyethylene alkyl allyl ethers such as polyoxyethylene octyl phenol ether, polyoxyethylene nonyl phenol ether or the like; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, sorbitan tristearate or the like; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate or the like, and polyoxyethylene sorbitan tristearate; and fluorinated surfactants such as F-top [registered trademark] EF301, EF303, and EF352 [product names, collectively manufactured by Mitsubishi Materials Electronic Chemicals Co., Ltd. (formerly Tochem Products)], Megafac [registered trademark] F171, F173, R-30, and R-40 [product names, collectively manufactured by DIC Corporation (formerly Dai Nippon Ink Co., Ltd.)], Fluorad FC430 and FC431 (product names, collectively manufactured by Sumitomo 3M Co., Ltd.), Asahi Guard [registered trademark] AG710, Surflon [registered trademark] S-382, SC101, SC102, SC103, SC104, SC105, and SC106 (product names, collectively manufactured by Asahi Glass Co., Ltd.); Organosiloxane Polymer KP341 (manufactured by Shin-Etsu Chemical Co., Ltd.); and the like.

The surfactant contained in the hard-mask forming composition of the present embodiment may be one type or two or more types.

Among these, the hard-mask forming composition of the present embodiment preferably contains a fluorinated surfactant.

In a case where the hard-mask forming composition of the present embodiment contains a surfactant, a content of the surfactant is preferably 0.01 to 10 parts by mass, more preferably 0.01 to 5 parts by mass, and further more preferably 0.05 to 1 parts by mass, based on 100 parts by mass of the total amount of the resin (P1). In a case where the content of the surfactant is within the preferable range stated above, a film surface when applying the hard-mask forming composition is made uniform, and striations (application defects such as wavy and striped patterns) can be further prevented.

Solvent

The solvent is used to dissolve the resin (P1) and the optional components.

Examples of the solvent include lactones such as γ-butyrolactone, or the like; ketones such as acetone, methyl ethyl ketone, cyclohexanone, methyl-n-pentyl ketone, methyl isopentyl ketone, 2-heptanone, or the like; polyhydric alcohols such as ethylene glycol, diethylene glycol, propylene glycol, dipropylene glycol, or the like; derivatives of polyhydric alcohols which include compounds having an ester bond such as ethylene glycol monoacetate, diethylene glycol monoacetate, propylene glycol monoacetate, or dipropylene glycol monoacetate, compounds having an ether bond such as monoalkyl ether or monophenyl ether such as monomethyl ether, monoethyl ether, monopropyl ether, monobutyl ether of the polyhydric alcohols or the compound having an ester bond, and the like [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, ethyl ethoxypropionate or the like; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, mesitylene or the like; dimethyl sulfoxide (DMSO); and the like.

Among these, PGME, PGMEA, ethyl lactate, butyl lactate, γ-butyrolactone, cyclohexanone, and mixed solvents thereof are preferable, from a viewpoint of further improving the leveling property, and cyclohexanone is more preferable.

The solvent may be used alone, or may be a mixed solvent of two or more types of solvents. Examples of the mixed solvent include a mixed solvent of PGME and γ-butyrolactone.

The amount of the solvent used is not particularly limited, and is appropriately set to a concentration applicable to a substrate or the like, depending on the thickness of a coating film. For example, the solvent may be blended so that the resin component concentration in the hard-mask forming composition falls within a range of 1% to 50% by mass, and preferably within a range of 10% to 30% by mass, and more preferably within a range of 10% to 20% by mass.

Crosslinking Acceleration Catalyst

Examples of the crosslinking acceleration catalyst include acidic compounds such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, and naphthalenecarboxylic acid, and the like. The crosslinking acceleration catalyst may be used alone, or two or more types thereof may be used in combination.

Thermal Acid Generator

The hard-mask forming composition of the present embodiment may contain a thermal acid generator (hereinafter, also referred to as "(T) component"), but preferably does not contain thereof.

Examples of the component (T) include perfluoroalkyl sulfonates (trifluoromethane sulfonate, perfluorobutane sulfonate, and the like) hexafluorophosphate, boron trifluoride salt, boron trifluoride ether complex, and the like.

Examples of preferable components (T) include a compound (T1) represented by General Formula (T-1) and consisting of a cationic part and an anionic part (hereinafter, also referred to as "component (T1)"), and a compound (T2) represented by General Formula (T-2) and consisting of a cationic part and an anionic part (hereinafter, also referred to as "component (T2)").

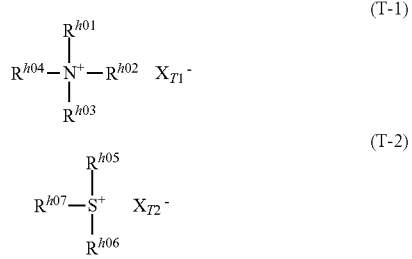

[In Formula (T-1), $R^{h01}$ to $R^{h04}$ are each independently a group selected from the group consisting of a hydrogen atom, an alkyl group having 1 to 20 carbon atoms, and an aryl group, and at least one of $R^{h01}$ to $R^{h04}$ is an aryl group. The alkyl group or aryl group may have a substituent. $X_{T1}^-$ is a counter anion.

In Formula (T-2), $R^{h05}$ to $R^{h07}$ are each independently a group selected from the group consisting of an alkyl group having 1 to 20 carbon atoms and an aryl group, and at least one of $R^{h05}$ to $R^{h07}$ is an aryl group. The alkyl group or aryl group may have a substituent. $X_{T2}^-$ is a counter anion.]

Regarding Anionic Part of Component (T1) and Component (T2)

Examples of $X_{T1}^-$ in Formula (T-1) and $X_{T2}^-$ in Formula (T-2) include a hexafluorophosphate anion, a perfluoroalkyl sulfonic acid anion (trifluoromethane sulfonate anion, perfluorobutane sulfonate anion, and the like), tetrakis(pentafluorophenyl) borate anion, and the like.

Among these, a perfluoroalkyl sulfonic acid anion is preferable, a trifluoromethane sulfonate anion or a perfluorobutane sulfonate anion is more preferable, and a trifluoromethane sulfonate anion is further more preferable.

Regarding Cationic Part of Component (T1)

In Formula (T-1), the alkyl group for $R^{h01}$ to $R^{h04}$ is an alkyl group having 1 to 20 carbon atoms, an alkyl group preferably having 1 to 10 carbon atoms, and an alkyl group more preferably having 1 to 5 carbon atoms, and is further more preferably a linear or branched alkyl group having 1 to 5 carbon atoms. Specific examples thereof include a methyl group, an ethyl group, a propyl group, an isopropyl group, an n-butyl group, an isobutyl group, a tert-butyl group, a pentyl group, an isopentyl group, a neopentyl group, and the like. Among these, a methyl group and an ethyl group are preferable.

The alkyl group for $R^{h01}$ to $R^{h04}$ may have a substituent. Examples of the substituent include an alkoxy group, a halogen atom, a halogenated alkyl group, a hydroxyl group, a carbonyl group, a nitro group, an amino group, a cyclic group, and the like.

The alkoxy group as the substituent of the alkyl group is preferably an alkoxy group having 1 to 5 carbon atoms, more preferably a methoxy group, an ethoxy group, an n-propoxy group, an iso-propoxy group, an n-butoxy group, and a tert-butoxy group, and further more preferably a methoxy group and an ethoxy group. Examples of the halogen atom as the substituent of the alkyl group include a fluorine atom, a chlorine atom, a bromine atom, an iodine atom, and the like, and the fluorine atom is preferable.

Examples of the halogenated alkyl group as the substituent of the alkyl group include an alkyl group having 1 to 5 carbon atoms, and a group in which a part or all of hydrogen atoms such as methyl group, ethyl group, propyl group, n-butyl group, and tert-butyl group is substituted with the halogen atom.

A carbonyl group as the substituent of the alkyl group is a group (>C=O) that substitutes a methylene group (—CH₂—) constituting the alkyl group.

Examples of the cyclic group as the substituent of the alkyl group include an aromatic hydrocarbon group and an alicyclic hydrocarbon group (which may be polycyclic or monocyclic). Examples of the aromatic hydrocarbon group here include the same as the aryl group for $R^{h01}$ to $R^{h04}$ to be stated later. In the alicyclic hydrocarbon group here, as the monocyclic alicyclic hydrocarbon group, a group obtained by removing one or more hydrogen atoms from a monocycloalkane is preferable. As the monocycloalkane, those having 3 to 6 carbon atoms are preferable, and specific examples thereof include cyclopentane, cyclohexane, and the like. In addition, as the polycyclic alicyclic hydrocarbon group, a group obtained by removing one or more hydrogen atoms from polycycloalkane is preferable, and as the polycycloalkane, those having 7 to 30 carbon atoms are preferable. Among these, as the polycycloalkane, a polycycloalkane having a polycyclic skeleton of a crosslinking ring system such as adamantane, norbornane, isobornane, tricyclodecane, and tetracyclododecane; and a polycycloalkane having a polycyclic skeleton of a condensed ring system such as a cyclic group having a steroid skeleton are more preferable.

In Formula (T-1), the aryl group for $R^{h01}$ to $R^{h04}$ is a hydrocarbon group having at least one aromatic ring.

The aromatic ring is not particularly limited as long as it is a cyclic conjugated system having $4n+2\pi$ electrons, and may be monocyclic or polycyclic. The aromatic ring preferably has 5 to 30 carbon atoms, more preferably has 5 to 20 carbon atoms, further more preferably has 6 to 15 carbon atoms, and particularly preferably has 6 to 12 carbon atoms.

Specific examples of the aromatic ring include an aromatic hydrocarbon ring such as benzene, naphthalene, anthracene, and phenanthrene; an aromatic heterocyclic ring in which a part of carbon atoms constituting the aromatic hydrocarbon ring is substituted with hetero atoms; and the like. Examples of the hetero atom in the aromatic heterocyclic ring include an oxygen atom, a sulfur atom, a nitrogen atom, and the like. Specific examples of the aromatic heterocyclic ring include a pyridine ring, a thiophene ring, and the like.

Specific examples of the aryl group for $R^{h01}$ to $R^{h04}$ include a group obtained by removing one hydrogen atom from the aromatic hydrocarbon ring or aromatic heterocyclic ring; a group obtained by removing one hydrogen atom from an aromatic compound (for example, biphenyl, fluorene, and the like) containing two or more aromatic rings; a group in which one hydrogen atom of the aromatic hydrocarbon ring or aromatic heterocyclic ring is substituted with an alkylene group (for example, arylalkyl group such as benzyl group, phenethyl group, 1-naphtylmethyl group, 2-naphtylmethyl group, 1-naphtylethyl group, 2-naphtylethyl group, and the like), and the like. The alkylene group to be bonded to the aromatic hydrocarbon ring or the aromatic heterocyclic ring preferably has 1 to 4 carbon atoms, more preferably has 1 to 2 carbon atoms, and particularly preferably has 1 carbon atom. Among these, a group obtained by removing one hydrogen atom from the aromatic hydrocarbon ring or aromatic heterocyclic ring, and a group in which one hydrogen atom of the aromatic hydrocarbon ring or aromatic heterocyclic ring is substituted with an alkylene group are preferable, and a group obtained by removing one hydrogen atom from the aromatic hydrocarbon ring and a group in which one hydrogen atom of the aromatic hydrocarbon ring is substituted with an alkylene group are further more preferable.

The aryl group for $R^{h01}$ to $R^{h04}$ may have a substituent. Examples of the substituent include an alkyl group, an alkoxy group, a halogen atom, a halogenated alkyl group, a hydroxyl group, a carbonyl group, a nitro group, an amino group, a cyclic group, an alkylcarbonyloxy group, and the like.

The alkyl group as the substituent of the aryl group is preferably an alkyl group having 1 to 5 carbon atoms, and preferably a methyl group, an ethyl group, a propyl group, an n-butyl group, and a tert-butyl group.

The description of the alkoxy group, the halogen atom, the halogenated alkyl group, the carbonyl group, and the cyclic group as the substituent of the aryl group is the same as the description of the alkoxy group, the halogen atom, the halogenated alkyl group, the carbonyl group, and the cyclic group as the substituent of the alkyl group stated above.

In the alkylcarbonyloxy group as a substituent of the aryl group, the alkyl part preferably has 1 to 5 carbon atoms, examples of the alkyl part include a methyl group, an ethyl group, a propyl group, an isopropyl group, and the like, and among these, a methyl group and an ethyl group are preferable, and a methyl group is more preferable.

Here, in Formula (T1), at least one of $R^{h01}$ to $R^{h04}$ is an aryl group which may have a substituent.

Hereinafter, preferable cations as the cationic part of the component (T1) are shown below.

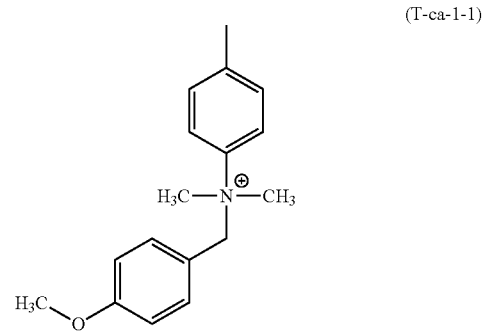

(T-ca-1-1)

Regarding Cationic Part of Component (T2)

In Formula (T-2), the description of the alkyl group and the aryl group for $R^{h05}$ to $R^{h07}$ is the same as the description of the alkyl group and aryl group for $R^{h01}$ to $R^{h04}$ stated above.

Here, in Formula (T-2), at least one of $R^{h05}$ to $R^{h07}$ is an aryl group which may have a substituent.

Hereinafter, preferable cations as the cationic part of the component (T2) are shown below.

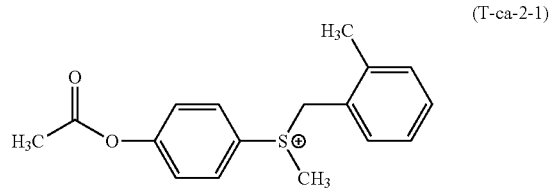

(T-ca-2-1)

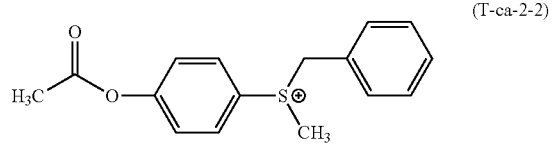

(T-ca-2-2)

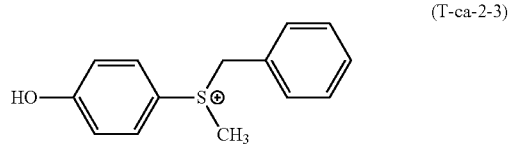

(T-ca-2-3)

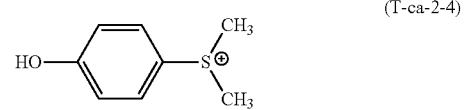

(T-ca-2-4)

The component (T) contained in the hard-mask forming composition of the present embodiment may be one type, or may be two or more types.

In a case where the hard-mask forming composition of the present embodiment contains the component (T), the content of the component (T) is preferably 1 part by mass or less, and more preferably 0.5 parts by mass or less, based on 100 parts by mass of the total amount of the resin (P1).

Photoacid Generator

Examples of the photoacid generator include onium salt photoacid generators such as bis(4-t-butylphenyl) iodonium trifluoromethanesulfonate, triphenylsulfonium trifluoromethanesulfonate, or the like; halogen-containing compound photoacid generators such as phenyl-bis (trichloromethyl)-s-triazine, or the like; sulfonic acid photoacid generators such as benzoin tosylate, N-hydroxysuccinimide trifluoromethanesulfonate, or the like; and the like. A blending amount of the photoacid generator is preferably 1 part by mass or less, and more preferably 0.5 parts by mass or less, based on 100 parts by mass of all resin components in the hard-mask forming composition. The photoacid generator may be used alone, or two or more types may be used in combination.

Absorbent

Examples of the absorbent include commercially available absorbents described in "Technology and Market for Industrial Dyes" (published by CMC) and "Dyes Handbook" (edited by the Society of Synthetic Organic Chemistry), for example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; C. I. Pigment Brown 2; and the like. A blending amount of the absorbent is preferably 10 parts by mass or less, and more preferably 5 parts by mass or less, based on 100 parts by mass of all resin components in the hard-mask forming composition. The absorbent may be used alone, or two or more types may be used in combination.

Rheology Modifier

Examples of the rheology modifier include phthalic acid derivatives such as dimethyl phthalate, diethyl phthalate, diisobutyl phthalate, dihexyl phthalate, butyl isodecyl phthalate, or the like; adipic acid derivatives such as dinormal butyl adipate, diisobutyl adipate, diisooctyl adipate, octyl decyl adipate, or the like; maleic acid derivatives such as dinormal butyl malate, diethyl malate, dinonyl malate, or the like; oleic acid derivatives such as methyl oleate, butyl oleate, tetrahydrofurfuryl oleate, or the like; and stearic acid derivatives such as normal butyl stearate, glyceryl stearate, or the like. A blending amount of the rheology modifier is preferably less than 30 parts by mass, based on 100 parts by mass of all resin components in the hard-mask forming composition. The rheology modifier may be used alone, or two or more types may be used in combination.

Adhesion Aider

Examples of the adhesion aider include chlorosilanes such as trimethylchlorosilane, dimethylvinylchlorosilane, methyldiphenylchlorosilane, chloromethyldimethylchlorosilane, or the like; alkoxysilanes such as trimethylmethoxysilane, dimethyldiethoxysilane, methyldimethoxysilane, dimethylvinylethoxysilane, diphenyldimethoxysilane, phenyltriethoxysilane, or the like; silazanes such as hexamethyldisilazane, N, N'-bis(trimethylsilyl) urea, dimethyltrimethylsilylamine, trimethylsilylimidazole, or the like; silanes such as vinyltrichlorosilane, γ-chloropropyltrimethoxysilane, γ-aminopropyltriethoxysilane, γ-glycidoxypropyltrimethoxysilane, or the like; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, mercaptopyrimidine, or the like; urea such as 1,1-dimethylurea, 1,3-dimethylurea, or the like; thiourea compounds; and the like. A blending amount of the adhesion aider is preferably less than 5 parts by mass, and more preferably less than 2 parts by mass, based on 100 parts by mass of all resin components in the hard-mask forming composition. The adhesion aider may be used alone, or two or more types may be used in combination.

The hard-mask forming composition of the present embodiment contains a resin (P1) having a repeating structure (u1). Since the repeating structure (u1) has an aromatic ring having at least one aromatic ring, nitrogen atom, or oxygen atom, and is a rigid structure, the repeating structure (u1) is excellent in etching resistance and heat resistance. In addition, since the repeating structure (u1) has a site in the side chain that acts as an acid by heating, the crosslinking reaction when curing the resin (P1) proceeds sufficiently, and the solvent resistance of the hard mask layer formed by the resin (P1) becomes high. In addition, the hard-mask forming composition of the present embodiment is excellent in outgassing reduction property since it is not necessary to separately add a thermal acid generator that can cause outgassing generation.

As described above, according to the hard-mask forming composition of the present embodiment, it is possible to form a hard mask layer that generates less outgassing during baking and has favorable etching resistance, solvent resistance, and heat resistance.

(Method for Manufacturing Electronic Component)

Specific examples of the method for manufacturing an electronic component according to second to fourth aspects of the present invention will be described with reference to FIGS. 1 to 8.

First Embodiment

The method for manufacturing an electronic component of the present embodiment includes: forming a hard mask layer (m1) on a support using the hard-mask forming composition stated above (hereinafter, referred to as "Step (i-i)"); and processing the support using the hard mask layer (m1) as a mask (hereinafter, referred to as "Step (i-a)").

FIG. 1 shows a support 10 formed of a substrate 11 and a processing layer 12.

Figure 2:
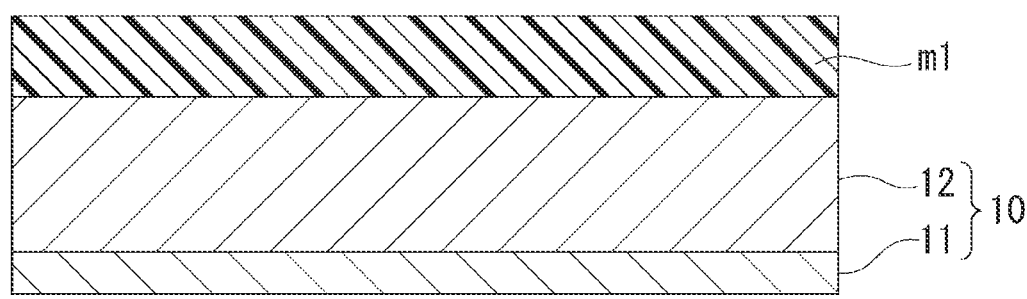
FIG. 2 is a view illustrating an exemplified process of forming a hard mask layer (m1) in the method for manufacturing an electronic component according to the embodiment of the present invention.

First, the hard mask layer (m1) is formed on the support 10 using the hard-mask forming composition according to the embodiment stated above (FIG. 2; Step (i-i)).

[Step (i-i)]

Step (i-i) is a step of forming the hard mask layer (m1) on the support 10 using the hard-mask forming composition according to the embodiment stated above.

The substrate 11 is not particularly limited and a known substrate in the related art can be used. Examples thereof include a substrate for an electronic component, a substrate on which a predetermined wiring pattern is formed, and the like. More specifically, examples of the substrate include silicon wafers, metal substrates made of copper, chromium, iron, and aluminum, glass substrates, and the like. As a material of the wiring pattern, copper, aluminum, nickel, gold, and the like can be used.

Examples of the processing layer 12 include various Low-k films such as films of Si, $SiO_2$, SiON, SiN, p-Si, α-Si, W, W—Si, Al, Cu, and Al—Si, and stopper films thereof. The processing layer 12 usually has a thickness of 50 to 10,000 nm. In addition, in a case of performing deep processing, the thickness of the processing layer 12 may fall within a range of 1,000 to 10,000 nm.

The support 10 may not have the processing layer 12, but in a case of forming the processing layer 12, the substrate 11 and the processing layer 12 are usually made of different materials.

The hard mask layer (m1) is formed using the hard-mask forming composition according to the embodiment stated above. Specifically, the hard-mask forming composition according to the embodiment stated above is applied onto the support 10 by a spin coating method or the like. Subsequently, the hard mask layer (m1) is formed by baking and curing. Baking is typically performed within a range of 100° C. to 500° C., preferably within a range of 200° C. to 450° C., and more preferably within a range of 250° C. to 400° C. The baking temperature is adjusted to be equal to or less than the upper limit value of the range stated above, and thus it is possible to suppress decrease in etching resistance due to the oxidation reaction of the resin. In addition, by setting the baking temperature to be the lower limit value or more of the range stated above, it is possible to suppress deterioration due to high temperature in the process described below. The baking time falls usually within a range of 10 to 600 seconds, preferably a range of 30 to 300 seconds, and more preferably a range of 50 to 200 seconds.

The film thickness of the hard mask layer (m1) is not particularly limited, and can be appropriately set according to the thickness of the processing layer 12. The film thickness of the hard mask layer (m1) can be within a range of 30 to 20,000 nm, for example. In addition, in a case of performing deep processing, the film thickness of the hard mask layer (m1) is preferably 1,000 nm or more. In this case, the film thickness of the hard mask layer (m1) falls preferably within a range of 1,000 to 20,000 nm, and more preferably within a range of 1,000 to 15,000 nm.

[Step (i-a)]

Step (i-a) is a step of processing the support 10 using the hard mask layer (m1) as a mask. The support 10 can be processed by, for example, performing etching using the hard mask layer (m1) as a mask. A method of etching is not particularly limited, and a common dry etching method and the like can be used.

Second Embodiment

The method for manufacturing an electronic component of the present embodiment includes:

forming a hard mask layer (m1) on a support using the hard-mask forming composition according to the embodiment stated above (hereinafter, referred to as "Step (ii-i)");

forming a hard mask layer (m2) made of an inorganic material on the hard mask layer (m1) (hereinafter, referred to as "Step (ii-ii)");

forming a resist film on the hard mask layer (m2) (hereinafter, referred to as "Step (ii-iii)");

forming a resist pattern on the hard mask layer (m2) by exposing the resist film and developing the exposed resist film (hereinafter, referred to as "Step (ii-iv)");

etching the hard mask layer (m2) using the resist pattern as a mask to form an inorganic pattern (hereinafter, referred to as "Step (ii-v)");

etching the hard mask layer (m1) using the inorganic pattern as a mask to form a resin pattern (hereinafter, referred to as "Step (ii-vi)"); and processing the support using the resin pattern as a mask (hereinafter, referred to as "Step (ii-vii)").

FIG. 1 shows a support 10 formed of a substrate 11 and a processing layer 12.

First, the hard mask layer (m1) is formed on the support 10 using the hard-mask forming composition according to the embodiment stated above (FIG. 2; Step (ii-i)).

Figure 3:
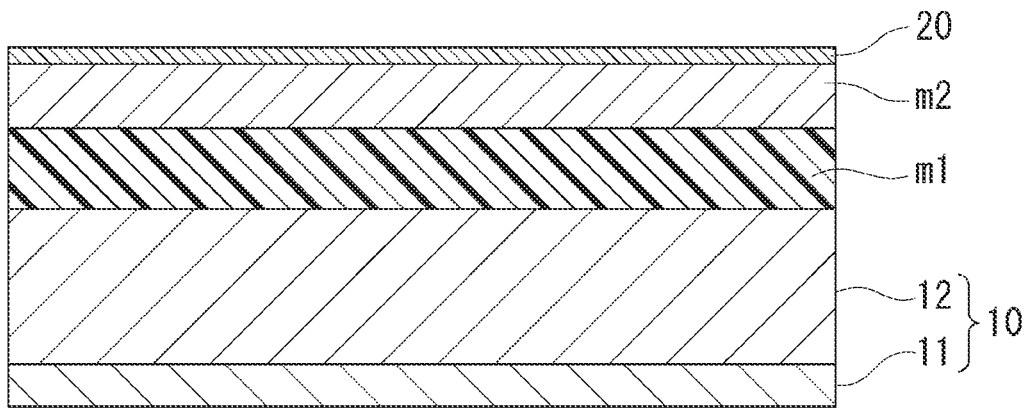
FIG. 3 is a view illustrating an exemplified process of forming a hard mask layer (m2) in the method for manufacturing an electronic component according to the embodiment of the present invention.

Subsequently, the hard mask layer (m2) made of an inorganic material is formed on the hard mask layer (m1) (FIG. 3; Step (ii-ii)). In addition, an antireflective film (BARC) 20 is formed on the hard mask layer (m2) if needed.

Figure 4:
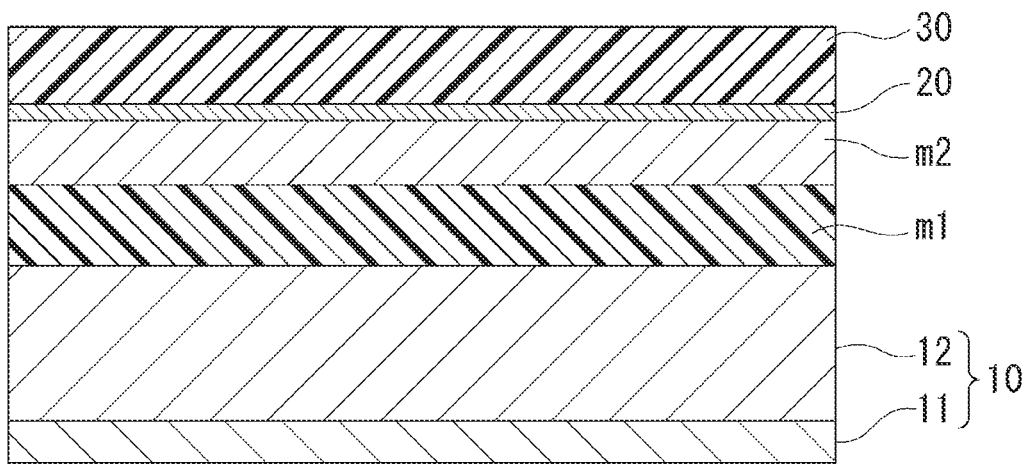
FIG. 4 is a view illustrating an exemplified process of forming a resist film in the method for manufacturing an electronic component according to the embodiment of the present invention.

Subsequently, a resist film 30 is formed on the hard mask layer (m2) using a resist composition (FIG. 4; step (ii-iii)).

Figure 5:
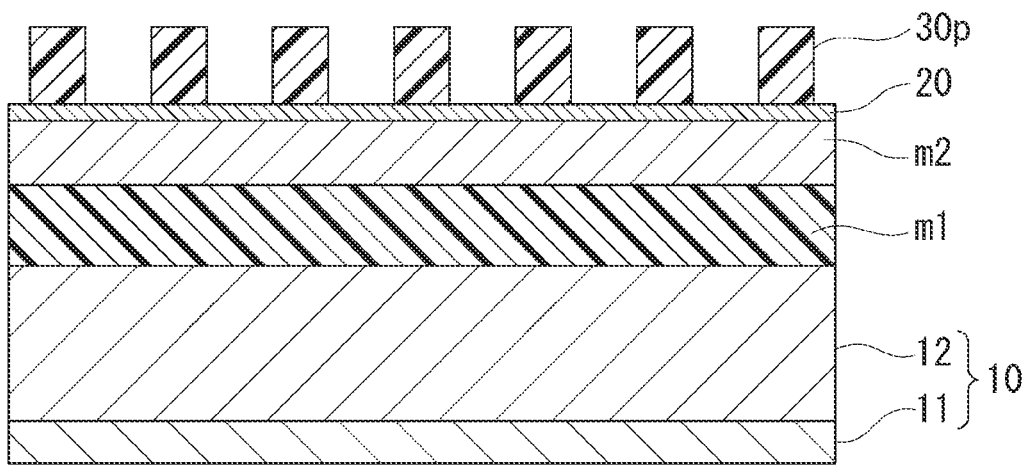
FIG. 5 is a view illustrating an exemplified process of forming a resist pattern in the method for manufacturing an electronic component according to the embodiment of the present invention.

Subsequently, a resist pattern 30p is formed on the hard mask layer (m2) by exposing and developing the resist film (FIG. 5; step (ii-iv)).

Figure 6:
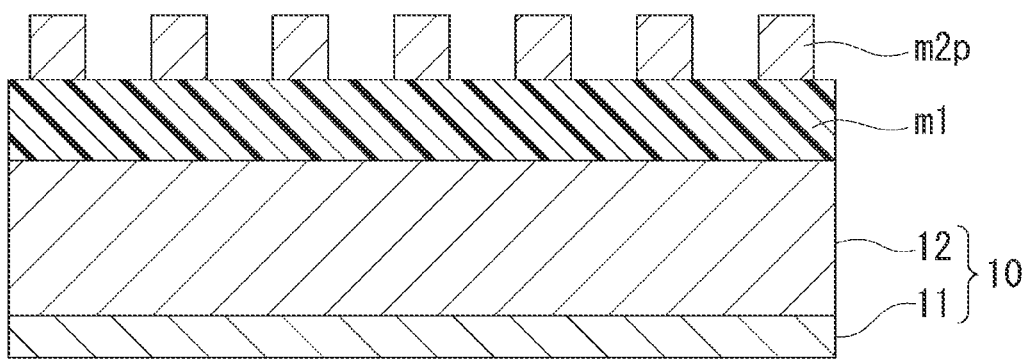
FIG. 6 is a view illustrating an exemplified process of forming an inorganic pattern in the method for manufacturing an electronic component according to the embodiment of the present invention.

Subsequently, the hard mask layer (m2) is etched using the resist pattern 30p as a mask to form an inorganic pattern (m2p) (FIG. 6; step (ii-v)).

Figure 7:
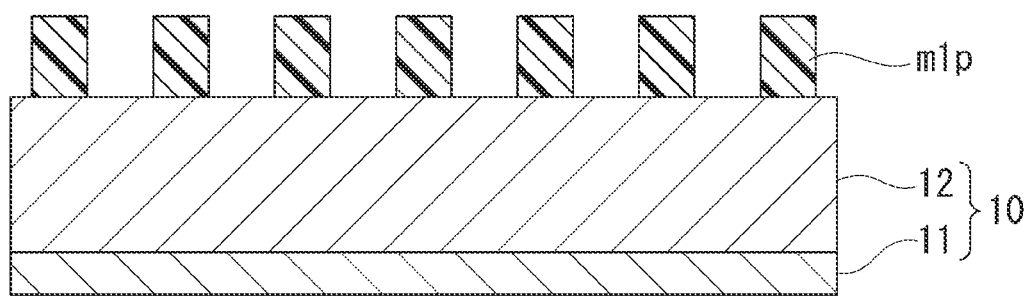
FIG. 7 is a view illustrating an exemplified process of forming a resin pattern in the method for manufacturing an electronic component according to the embodiment of the present invention.

Subsequently, the hard mask layer (m1) is etched using the inorganic pattern (m2p) as a mask to form a resin pattern (m1p) (FIG. 7; step (ii-vi)).

Figure 8:
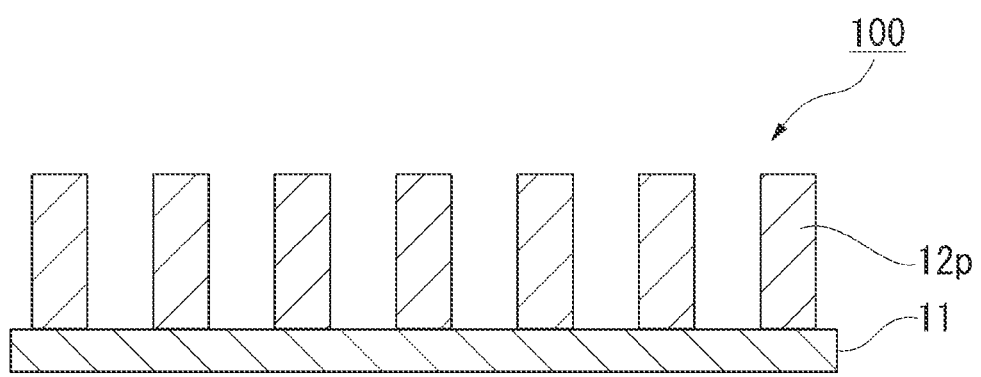
FIG. 8 is a view illustrating an exemplified process of processing a support in the method for manufacturing an electronic component according to the embodiment of the present invention.

Subsequently, the support 10 is processed using the resin pattern (m1p) as a mask to form a pattern 12p (FIG. 8; step (ii-vii)).

Thus, an electronic component 100 provided with the pattern 12p on the substrate 11 can be manufactured.

[Step (ii-i)]

Step (ii-i) is the same as Step (i-i) stated above.

[Step (ii-ii)]

Step (ii-ii) is a step of forming the hard mask layer (m2) made of an inorganic material on the hard mask layer (m1).

The inorganic material for forming the hard mask layer (m2) is not particularly limited, and known materials in the related art can be used. Examples of the inorganic material include a silicon oxide film ($SiO_2$ film), a silicon nitride film ($Si_3N_4$ film), a silicon oxynitride film (SiON film), and the like. Among these, a SiON film having a high effect as an antireflective film is preferable. The hard mask layer (m2) can be formed by a CVD method, an ALD method, and the like.

The film thickness of the hard mask layer (m2) is, for example, about 5 to 200 nm, and preferably about 10 to 100 nm.

In a case where the CVD method or the ALD method is used to form the hard mask layer (m2), a temperature becomes high (about 400° C.), and thus the hard mask layer (m1) is required to have high temperature resistance. The hard-mask forming composition according to the embodiment stated above is excellent in heat resistance, and shrinkage is not easily generated even when exposed to a high temperature of about 400° C. Therefore, the hard-mask forming composition can be suitably used in combination with the inorganic hard mask layer formed by the CVD method or the ALD method.

After forming the hard mask layer (m2), if needed, the antireflective film (BARC) 20 may be formed on the hard mask layer (m2). The BARC layer 20 may be an organic BARC, or may be an inorganic BARC. The BARC can be formed using a known method in the related art.

[Step (ii-iii)]

Step (ii-iii) is a step of forming the resist film 30 on the hard mask layer (m2) using a resist composition.

The resist composition is not particularly limited, and those proposed as a resist material suitable for a method using an exposure step can be generally used. The resist composition may be a positive type or a negative type. Examples of the resist composition include those containing a base component of which solubility in a developer changes due to action of the acid, and an acid generator component that generates the acid upon exposure.

The formation of the resist film 30 is not particularly limited, and a method generally used for forming the resist film 30 may be used. For example, the resist composition is applied by a spinner on the hard mask layer (m2) (in a case where the BARC layer 20 is formed, on the BARC layer 20 formed on the hard mask layer (m2)), and baked (post-apply baking (PAB)), for example, at a temperature condition of 80° C. to 150° C. for 40 to 120 seconds, and preferably for 60 to 90 seconds, thereby forming the resist film 30.

A film thickness of the resist film 30 is not particularly limited, but is generally about 30 to 500 nm.

[Step (ii-iv)]

Step (ii-iv) is a step of forming the resist pattern 30p on the hard mask layer (m2) by exposing and developing the resist film 30.

The resist film 30 can be exposed to light using an exposure apparatus such as an ArF exposure apparatus, a KrF exposure apparatus, an electron beam drawing apparatus, an EUV exposure apparatus, and the like. A wavelength used for exposure is not particularly limited, and exposure can be performed using ArF excimer laser, KrF excimer laser, $F_2$ excimer laser, EUV (extreme ultraviolet), VUV (vacuum ultraviolet), EB (electron beam), radiation such as X-ray and soft X-ray, and the like. The resist film 30 may be exposed by normal exposure (dry exposure) performed in an inert gas such as air and nitrogen, or by Liquid Immersion Lithography.

For example, the resist film 30 is selectively exposed by exposure through a photomask (mask pattern) on which a predetermined pattern is formed, by drawing with direct irradiation of the electron beam without a photomask, or the like. Subsequently, the resist film 30 is baked (post-exposure baking (PEB)), for example, at a temperature condition of 80° C. to 150° C. for 40 to 120 seconds, and preferably for 60 to 90 seconds.

Subsequently, the resist film 30 is developed. A developer used for the development can be appropriately selected from commonly used developers, depending on a type of the resist composition and a development method. For example, in a case of employing an alkali development process, an alkali developer is used, and in a case of employing a solvent development process, a developer (organic developer) containing an organic solvent is used.

Examples of the alkali developer used for development in the alkali development process include an aqueous solution of 0.1% to 10% by mass of tetramethylammonium hydroxide (TMAH).

Examples of the organic solvent contained in the organic developer used for development in the solvent development process include polar solvents such as a ketone-based solvent, an ester-based solvent, an alcohol-based solvent, a nitrile-based solvent, an amide-based solvent, an ether-based solvent, and the like; a hydrocarbon-based solvent; and the like.

The development process can be carried out by a known development method, and examples thereof include a method of immersing the support in the developer for a fixed time (dipping method); a method of raising the developer on a surface of the support by surface tension and standing still for a fixed time (paddling method); a method of spraying the developer on the surface of the support (spraying method); a method of continuously applying the developer while scanning the developer-coating nozzle at a constant speed on the support rotating at a constant speed (dynamic dispensing method); and the like.

After the development process, the developed film is preferably rinsed. In a case of the alkali development process, the developed film is preferably rinsed using pure water, and in a case of the solvent development process, the developed film is preferably rinsed using a rinse solution containing an organic solvent.

In a case of the solvent development process, after the development or rinsing, the developer or rinse solution adhering on the pattern may be removed with a supercritical fluid.

After the development or rinsing, the film is dried. In addition, the film may be baked (post baking) after the development if needed.

Therefore, the resist pattern 30p can be formed on the hard mask layer (m2).

[Step (ii-v)]

Step (ii-v) is a step of etching the hard mask layer (m2) using the resist pattern 30p as a mask to form an inorganic pattern (m2p).

A method of etching the hard mask layer (m2) is not particularly limited, and for example, common dry etching can be used. Examples of the etching method include chemical etching such as down flow etching, chemical dry etching, or the like; physical etching such as sputter etching, ion beam etching, or the like; and chemical-physical etching such as RIE (reactive ion etching), or the like.

For example, in parallel plate RIE, a multilayer laminate is placed in a chamber of an RIE apparatus, and necessary etching gas is introduced. In a case where a high frequency voltage is applied to a holder of the multilayer laminate placed in parallel with an upper electrode in the chamber, the etching gas is made into plasma. Etching species including charged particles such as positive and negative ions or electrons, and neutral active species are present in the plasma. In a case where these etching species are adsorbed to a lower resist layer, a chemical reaction occurs, a reaction product leaves a surface and is exhausted to the outside, and etching is proceeded.

Examples of the etching gas used for etching the hard mask layer (m2) include halogen-based gas. Examples of the halogen-based gas include hydrocarbon gas in which part or all of hydrogen atoms are substituted with halogen atoms such as fluorine atoms, chlorine atoms, and the like. More specifically, examples thereof include fluorinated carbon-based gas such as tetrafluoromethane ($CF_4$) gas and trifluoromethane ($CHF_3$) gas; carbon chloride-based gas such as tetrachloromethane ($CCl_4$) gas; and the like.

[Step (ii-vi)]

Step (ii-vi) is a step of etching the hard mask layer (m1) using the inorganic pattern (m2p) as a mask to form the resin pattern (m1p).

A method of etching is not particularly limited, and common dry etching can be employed the same as in Step (ii-vi). Examples of the etching gas used for etching the hard mask layer (m1) include oxygen gas, sulfur dioxide gas, halogen-based gas, and the like. Preferable examples of the etching gas include oxygen plasma etching using oxygen gas as the etching gas and the like.

[Step (ii-vii)]

Step (ii-vii) is a step of processing the support 10 using the resin pattern (m1p) as a mask.

The support 10 can be processed by, for example, etching the processing layer 12 using the resin pattern (m1p) as a mask. A method of etching is not particularly limited, and common dry etching can be employed the same as in Step (ii-vi). Examples of the etching gas used for etching the processing layer 12 include halogen-based gas.

In the method for manufacturing an electronic component according to the present embodiment, the hard mask layer (m1) can be thickened (1 μm or more) since the hard mask layer (m1) is formed using the hard-mask forming composition according to the embodiment stated above. Therefore, the resin pattern formed from the hard mask layer (m1) can be suitably used as a mask for deep processing.

The method for manufacturing an electronic component by the three-layer resist method has been stated above, but the electronic component may be manufactured by the two-layer resist method. In this case, the resist film 30, instead of the hard mask layer (m2), is formed on the hard mask layer (m1).

The resist film 30 is exposed and developed to form a resist pattern 30p on the hard mask layer (m1) in the same manner as in Step (iv).

Subsequently, the hard mask layer (m1) is etched using the resist pattern 30p as a mask to form a resin pattern (m1p) in the same manner as in Step (vi).

After that, the support 10 is processed using the resin pattern (m1p) as a mask to form a pattern 12p in the same manner as in Step (vii).

Thus, the electronic component can also be manufactured by the two-layer resist method.

Therefore, the present invention also provides a method for manufacturing an electronic component, including:

forming the hard mask layer (m1) on the support using the hard-mask forming composition according to the embodiment stated above;

forming the resist film on the hard mask layer (m1);

forming a resist pattern on the hard mask layer (m1) by exposing the resist film and developing the exposed resist film;

etching the hard mask layer (m1) using the resist pattern as a mask to form a resin pattern; and processing the support using the resin pattern as a mask.

Third Embodiment

The method for manufacturing an electronic component of the present embodiment includes:

forming a hard mask layer (m1) on a support using the hard-mask forming composition according to the embodiment stated above (hereinafter, referred to as "Step (iii-i)");

forming an inorganic pattern made of an inorganic material on the hard mask layer (m1) (hereinafter, referred to as "Step (iii-v)");

etching the hard mask layer (m1) using the inorganic pattern as a mask to form a resin pattern (hereinafter, referred to as "Step (iii-vi)"), and processing the support using the resin pattern as a mask (hereinafter, referred to as "Step (iii-vii)").

The method for manufacturing an electronic component according to a fourth aspect is the same as the method for manufacturing an electronic component according to the third aspect, except that the inorganic pattern made of an inorganic material is formed directly on the hard mask layer (m1) without forming a resist film.

Hereinafter, a specific example of the method for manufacturing an electronic component according to the present embodiment will be described with reference to FIGS. 1, 2, and 6 to 8. However, the manufacturing method according to the present embodiment is not limited thereto.

First, the hard mask layer (m1) is formed on the support 10 using the hard-mask forming composition according to the embodiment stated above (FIGS. 1 and 2; Step (iii-i)). The present step is the same as Step (ii-i) stated above.

Subsequently, the inorganic pattern (m2p) made of an inorganic material is formed on the hard mask layer (m1) (FIG. 6; Step (iii-v)). As the inorganic material for forming the inorganic pattern (m2p), the same inorganic material as exemplified in Step (ii-ii), a resist composition containing the inorganic material, and the like can be employed. A method for forming the inorganic pattern (m2p) is not particularly limited, and a known method in the related art can be used. For example, the inorganic pattern (m2p) can be formed on the hard mask layer (m1) by forming an inorganic resist film on the hard mask layer (m1) using a resist composition containing an inorganic material, and exposing the film and developing the exposed film.

Subsequently, the hard mask layer (m1) is etched using the inorganic pattern (m2p) as a mask to form the resin pattern (m1p) (FIG. 7; Step (iii-vi)). The present step is the same as Step (ii-vi) stated above.

Subsequently, the support 10 is processed using the resin pattern (m1p) as a mask to form a pattern 12p (FIG. 8; Step (iii-vii)). The present step is the same as Step (ii-vii) stated above.

The electronic component 100 provided with the pattern 12p on the substrate 11 can also be manufactured in this manner.

In the method for manufacturing an electronic component according to each embodiment stated above, since the hard mask layer (m1) is formed using the hard-mask forming composition of the embodiment stated above, an amount of outgassing generated during baking is small. In addition, the hard mask layer (m1) has favorable etching resistance, solvent resistance, and heat resistance. Due to these synergistic effects, a high-quality electronic component can be manufactured more stably.

(Resin)

A fifth aspect of the present invention is a resin having a repeating structure (u1) represented by General Formula (u1-0).

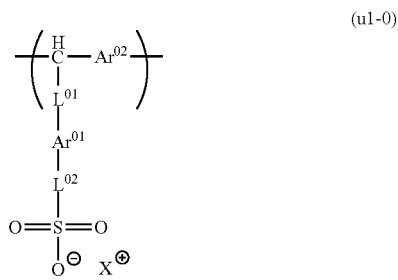

(u1-0)

[In the formula, $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. X is a hydrogen atom, $NH_4$, a compound obtained by adding a hydrogen atom to an amine, or a quaternary ammonium].

The resin in the present embodiment is the same as the resin (P1) stated above, and $Ar^{01}$, $L^{01}$, $L^{02}$, $Ar^{02}$, and X in Formula (u1-0) are all the same as described in the resin (P1) stated above.

The repeating structure (u1) is more preferably the repeating structure (u11), the repeating structure (u12), and the repeating structure (u13) stated above.

In addition, the resin in the present embodiment particularly preferably has one or more repeating structures (u2) selected from the group consisting of the repeating structure (u21), the repeating structure (u22), and the repeating structure (u23) stated above.

<Resin Manufacturing Method>

Examples of a method for manufacturing the resin (resin (P1)) of the present embodiment include a manufacturing method including: reacting an aldehyde compound represented by General Formula (m-a) with a monomer for inducing $Ar^{02}$ in General Formula (u1-0) in the presence of an acid catalyst to obtain a resin (P1pre) having a repeating structure represented by General Formula (u1-Pre); and Examples thereof include a manufacturing method including a step of reacting the resin (P1pre) with ammonia, an amine compound, or a quaternary ammonium salt to obtain the resin (resin (P1)) of the present embodiment.

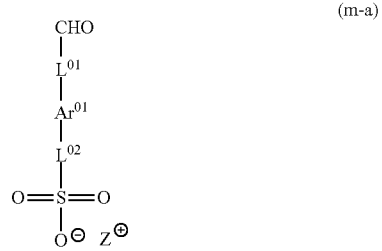

(m-a)

[In the formula, $Ar^{01}$ is an aromatic hydrocarbon group which may have a substituent. $L^{01}$ and $L^{02}$ are each independently a single-bonded or divalent linking group. $Z^+$ is a counter cation.]

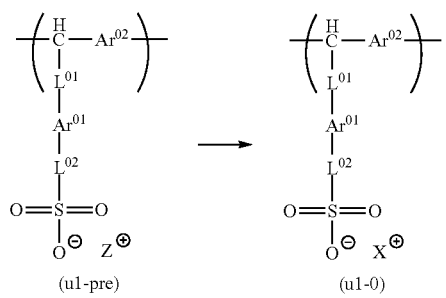

(u1-pre)  (u1-0)

[In Formula (u1-pre), $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. $Z^+$ is a counter cation.

In Formula (u1-0), $Ar^{01}$ is an aromatic hydrocarbon group which may have a substituent. $L^{01}$ and $L^{02}$ are each independently a single-bonded or divalent linking group. $Ar^{02}$ is an aromatic hydrocarbon group which may have a substituent. Here, $Ar^{02}$ has at least one nitrogen atom or oxygen atom. X is a hydrogen atom, $NH_4$, a compound obtained by adding a hydrogen atom to an amine, or a quaternary ammonium].

<<Step of Obtaining Resin (P1pre)>>

The step of obtaining the resin (P1pre) is a step of reacting the aldehyde compound represented by General Formula (m-a) with a monomer for inducing $Ar^{02}$ in General Formula (u1-0) in the presence of an acid catalyst.

Aldehyde Compound $Ar^{01}$, $L^{01}$ and $L^{02}$ in the aldehyde compound represented by General Formula (m-a) are the same as those described in the resin (P1) stated above.

$Z^+$ is a counter cation, and examples thereof include a hydrogen ion and an alkali metal ion. Preferable specific examples of the alkali metal ion include a sodium ion.

Specific examples of the aldehyde compound include sodium sulfobenzaldehyde.

Monomer for Inducing $Ar^{02}$ in General Formula (u1-0)

Examples of the monomer for inducing $Ar^{02}$ in General Formula (u1-0) include a phenol compound, an indole compound, a carbazole compound, and the like.

Examples of such a phenol compound include phenol; cresols such as m-cresol, p-cresol, o-cresol, and the like; xylenols such as 2,3-xylenol, 2,5-xylenol, 3,5-xylenol, 3,4-xylenol, and the like; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and the like; alkoxyphenols such as p-methoxyphenol, m-methoxyphenol, p-ethoxyphenol, m-ethoxyphenol, p-propoxyphenol, m-propoxyphenol, and the like; isopropenylphenols such as o-isopropenylphenol, p-isopropenylphenol, 2-methyl-4-isopropenylphenol, 2-ethyl-4-isopropenylphenol, and the like; arylphenols such as phenyl phenol and the like; polyhydroxyphenols such as 4,4'-dihydroxybiphenyl, bisphenol A, resorcinol, hydroquinone, pyrogallol, 9,9-bis (4-hydroxy-3,5-dimethylphenyl) fluorene, 9,9-bis (4-hydroxy-3-methylphenyl) fluorene, 1,1-bis (4-hydroxy-3-methylphenyl) cyclohexane, and the like; and the like.

The indole compound is not particularly limited as long as the indole compound has a ring structure in which a benzene ring and a pyrrole ring are condensed, and examples thereof include indole, 2-phenylindole, and the like.

The carbazole compound is not particularly limited as long as the compound has a ring structure in which benzene rings are condensed one by one on the b and d sides (2,3-position and 4,5-position) of pyrrole, and examples thereof include carbazole, 9-(1-naphthyl) carbazole, and the like.

Acid Catalyst

Examples of the acid catalyst include paratoluene sulfonic acid, methane sulfonic acid, hydrochloric acid, nitric acid, sulfuric acid, formic acid, oxalic acid, acetic acid, and the like.

Specific examples of the repeating structure represented by General Formula (u1-Pre) are shown below.

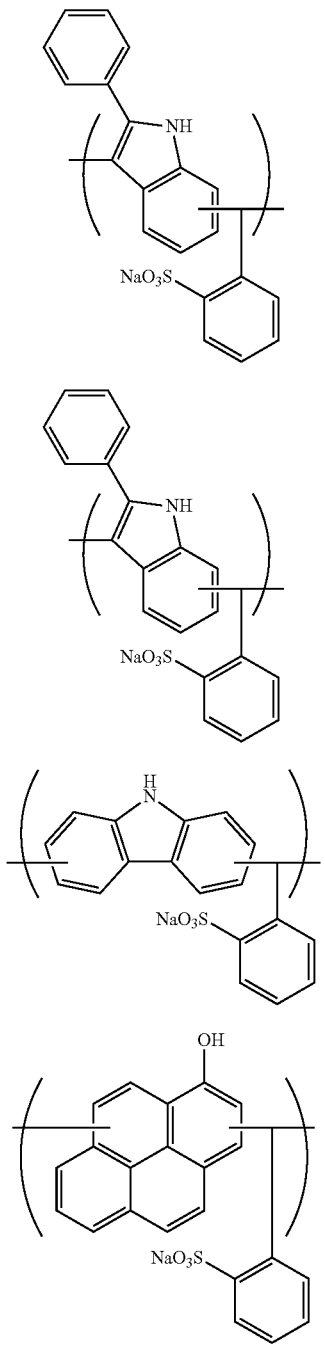

(u1pre-1)

(u1pre-2)

(u1pre-3)

(u1pre-4)

<<Step of Obtaining Resin (Resin (P1)) of Present Embodiment>>

The step of obtaining the resin (resin (P1)) of the present embodiment is a step of obtaining the resin (resin (P1)) of the present embodiment by reacting the resin (P1pre) with ammonia, an amine compound, or a quaternary ammonium salt.

Examples of the amine compound include an aliphatic amine, a hybrid amine, an aromatic amine, a heterocyclic amine, a nitrogen-containing compound having a carboxy group, a nitrogen-containing compound having a sulfonyl group, a nitrogen-containing compound having a hydroxyl group, an amide derivative, an imide derivative, and the like.

Examples of the quaternary ammonium salt include tetramethylammonium chloride, tetraethylammonium chloride, and the like.

In a case where X in General Formula (u1-0) is a hydrogen atom, $Z^+$ in Formula (m-a) becomes a hydrogen ion, and the present step is not provided.

That is, in a case where X in General Formula (u1-0) is a hydrogen atom, it is possible to obtain the resin (resin (P1)) of the present embodiment by reacting the aldehyde compound ($Z^+$ is a hydrogen ion) represented by Formula (m-a) with the monomer for inducing $Ar^{o2}$ in General Formula (u1-0) in the presence of an acid catalyst.

Examples of the specific manufacturing method of the resin (resin (P1)) of the present embodiment include a method of obtaining the resin (resin (P1)) of the present embodiment by reacting an aldehyde compound represented by General Formula (m-a) stated above, an aldehyde compound other than the aldehyde compound (hereinafter, referred to as other aldehyde compound), and a monomer for inducing $Ar^{o2}$ in General Formula (u1-0) in the presence of an acid catalyst stated above to obtain a precursor, and then reacting the precursor with ammonia, an amine compound, or a quaternary ammonium salt.

Other Aldehyde Compounds

Specific examples of the other aldehyde compound include formaldehyde, paraformaldehyde, trioxane, furfural, benzaldehyde, terephthalaldehyde, phenylacetaldehyde, α-phenylpropyl aldehyde, β-phenylpropyl aldehyde, o-hydroxy benzaldehyde, m-hydroxy benzaldehyde, p-hydroxy benzaldehyde, o-methyl benzaldehyde, m-methyl benzaldehyde, p-methyl benzaldehyde, o-chlorobenzaldehyde, m-chlorobenzaldehyde, p-chlorobenzaldehyde, cinnamaldehyde, 4-isopropyl benzaldehyde, 4-isobutyl benzaldehyde, 4-phenyl benzaldehyde, 1-naphthaldehyde, 1-pyrene carboxyaldehyde, and the like.

The resin of the present embodiment stated above has a repeating structure (u1). The repeating structure (u1) has an aromatic ring and an aromatic ring having at least one of a nitrogen atom or an oxygen atom, and is a rigid structure. In addition, the repeating structure (u1) has a site in the side chain that acts as an acid by heating. Therefore, the resin of the present embodiment is a useful material as a resin in the hard-mask forming composition stated above.

EXAMPLES

Hereinafter, the present invention will be described in more detail referring to examples. However, the present invention is not limited to these examples.

Production Example 1

<Production Example of Resin (P1-1-1)>

9.7 g of 2-phenylindole (50 mmol, manufactured by Tokyo Chemical Industry Co., Ltd.), 7.7 g of 1-naphthaldehyde (49 mmol, manufactured by Tokyo Chemical Industry Co., Ltd.), 0.21 g of sodium sulfobenzaldehyde (1 mmol, manufactured by Tokyo Chemical Industry Co., Ltd.), 45 g of gamma butyrolactone, and 1.0 g of methanesulfonic acid (10 mmol, manufactured by Tokyo Chemical Industry Co., Ltd.) were added, and the temperature was raised to 100° C. while stirring to start the reaction. After 8 hours therefrom, the mixture was allowed to be cooled to room temperature, and then reprecipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol.

The obtained brown powder was vacuum dried for 24 hours to obtain 14 g of a resin (P1-1-1). The weight average molecular weight Mw measured by GPC in terms of polystyrene was 2,800, and the polydispersity Mw/Mn was 1.5.

A ratio of the repeating structure estimated from the charged amount of each raw material (ratio of each repeating structure in the structural formula (molar ratio)) is l/m=98/2.

The obtained resin (P1-1-1) was subjected to NMR measurement, and the molecular structure was identified from the following analysis results.

$^{13}$C-NMR (150 MHz, THF) δ(ppm)=46 (1C, Ar3C—H), 110-143 (25C, ArC)

Resin (P1-1-1)

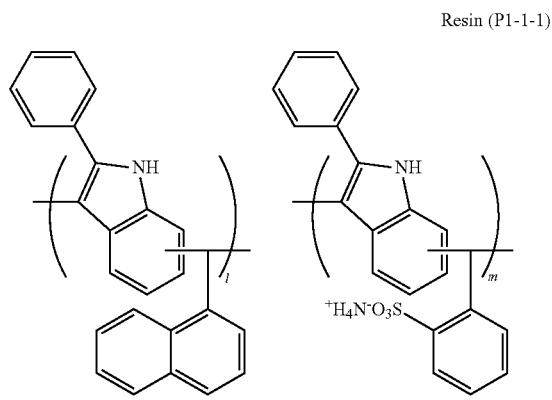

[Measurement of Acid Value]

The resin (P1-1-1) was dissolved in a mixed solvent of tetrahydrofuran/water=9/1 (mass ratio), and the obtained solution was neutralized and titrated with a 0.1 mol/L sodium hydroxide aqueous solution using a potentiometric titration device (product name: AT-510, manufactured by Kyoto Electronics Co., Ltd.) at 25° C. The acid value was calculated by the following formula with the inflection point of the titration pH curve as a titration end point.

$A = 56.11 \times Vs \times 0.1 \times f/w$

A: Acid value (mgKOH/g)

Vs: A mount of 0.1 mol/L sodium hydroxide aqueous solution required for titration (mL)

f: Titer of 0.1 mol/L sodium hydroxide aqueous solution w: Mass (g) of measurement sample (in terms of solid content)

The acid value measured by the above method was 3.5 mg/g. From this, it can be confirmed that the resin (P1-1-1) has a site that acts as an acid derived from sodium sulfobenzaldehyde.

Production Example 2

<Production Example of Resin (P1-1-2)>

9.7 g of 2-phenylindole (50 mmol, manufactured by Tokyo Chemical Industry Co., Ltd.), 11.3 g of 1-pyrene carboxyaldehyde (49 mmol, manufactured by Aldrich), 0.21 g of sodium sulfobenzaldehyde (1 mmol, manufactured by Tokyo Chemical Industry Co., Ltd.), 54 g of gamma butyrolactone, and 1.0 g of methanesulfonic acid (10 mmol, manufactured by Tokyo Chemical Industry Co., Ltd.) were added, and the temperature was raised to 100° C. while stirring to start the reaction. After 15 hours therefrom, the mixture was allowed to be cooled to room temperature, and then re-precipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol. The obtained brown powder was vacuum dried for 24 hours to obtain 19 g of a resin (P1-1-2).

The weight average molecular weight Mw measured by GPC in terms of polystyrene was 2,400, and the polydispersity Mw/Mn was 1.4.

A ratio of the repeating structure estimated from the charged amount of each raw material (ratio of each repeating structure in the structural formula (molar ratio)) is l/m=98/2.

The obtained resin (P1-1-2) was subjected to NMR measurement, and the molecular structure was identified from the following analysis results.

$^{13}$C-NMR (150 MHz, THF) δ(ppm)=46(1C, Ar3C—H), 110-143(25C, ArC)

Resin (P1-1-2)

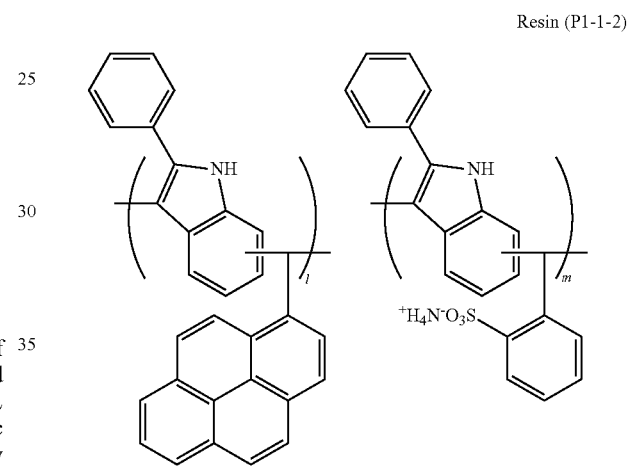

The acid value of the resin (P1-1-2) measured by the same method as that of the resin (P1-1-1) was 2.8 mg/g. From this, it can be confirmed that the resin (P1-1-2) has a site that acts as an acid derived from sodium sulfobenzaldehyde.

Production Example 3

<Production Example of Resin (P1-1-3)>

17 g of the resin (P1-1-3) was obtained in the same manner as in <Production Example of Resin (P1-1-2)> except that the amount of 1-pyrene carboxyaldehyde, sodium sulfobenzaldehyde, and methanesulfonic acid charged was changed to 11.1 g (48 mmol) of 1-pyrene carboxyaldehyde, 0.42 g (2 mmol) of sodium sulfobenzaldehyde, and 1.9 g (20 mmol) of methanesulfonic acid.

The weight average molecular weight Mw measured by GPC in terms of polystyrene was 2,200, and the polydispersity Mw/Mn was 1.4.

The ratio of the repeating structure estimated from the charged amount of each raw material (ratio of each repeating structure in the structural formula (molar ratio)) is l/m=96/4.

The obtained resin (P1-1-3) was subjected to NMR measurement, and the molecular structure was identified from the following analysis results.

$^{13}$C-NMR=46 (1C, Ar3C—H), 110-143 (31C, ArC)

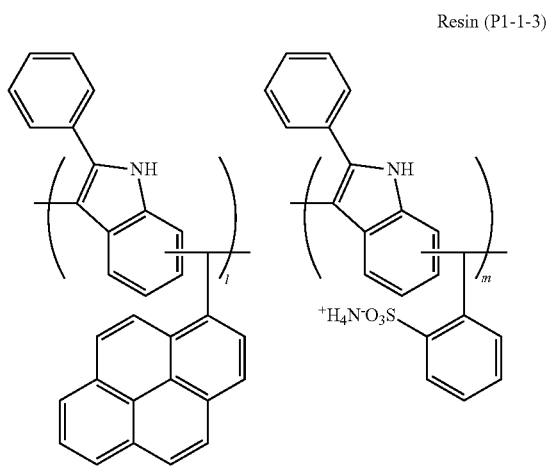

Resin (P1-1-3)

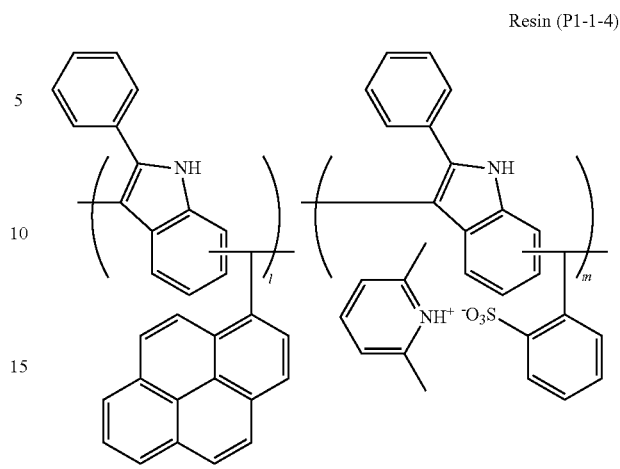

Resin (P1-1-4)

The acid value of the resin (P1-1-3) measured by the same method as that of the resin (P1-1-1) was 5.1 mg/g. From this, it can be confirmed that the resin (P1-1-3) has a site that acts as an acid derived from sodium sulfobenzaldehyde.

Production Example 4

<Production Example of Resin (P1-1-4)>

9.7 g of 2-phenylindole (50 mmol, manufactured by Tokyo Chemical Industry Co., Ltd.), 11.3 g of 1-pyrene carboxyaldehyde (49 mmol, manufactured by Aldrich), 0.21 g of sodium sulfobenzaldehyde (1 mmol, manufactured by Tokyo Chemical Industry Co., Ltd.), 54 g of gamma butyrolactone, and 1.0 g of methanesulfonic acid (10 mmol, manufactured by Tokyo Chemical Industry Co., Ltd.) were added, and the temperature was raised to 100° C. while stirring to start the reaction. After 15 hours therefrom, the mixture was allowed to be cooled to room temperature, and then re-precipitated into 300 g of an 8:2 mixed solution of methanol and a 10% aqueous 2,6-dimethyl pyridine solution. The obtained precipitate was filtered and washed with 300 g of an 8:2 mixed solution of methanol and 300 g of a 10% aqueous 2,6-lutidine solution, and further washed with 300 g of methanol. The obtained brown powder was vacuum dried for 24 hours to obtain 19 g of a resin (P1-1-4).

The weight average molecular weight Mw measured by GPC in terms of polystyrene was 2,500, and the polydispersity Mw/Mn was 1.4.

A ratio of the repeating structure estimated from the charged amount of each raw material (ratio of each repeating structure in the structural formula (molar ratio)) is l/m=98/2.

The obtained resin (P1-1-4) was subjected to NMR measurement, and the molecular structure was identified from the following analysis results.

$^{13}$C-NMR=46 (1C, Ar3C—H), 110-143 (31C, ArC)

The acid value of the resin (P1-1-4) measured by the same method as that of the resin (P1-1-1) was 2.7 mg/g. From this, it can be confirmed that the resin (P1-1-4) has a site that acts as an acid derived from sodium sulfobenzaldehyde.

Production Example 5

<Production Example of Resin (P1-1-5)>

8.4 g of carbazole (50 mmol, manufactured by Tokyo Chemical Industry Co., Ltd.), 7.7 g of 1-naphtaldehyde (49 mmol, manufactured by Tokyo Chemical Industry Co., Ltd.), 0.21 g of sodium sulfobenzaldehyde (1 mmol, manufactured by Tokyo Chemical Industry Co., Ltd.), 41 g of gamma butyrolactone, and 1.0 g of methanesulfonic acid (10 mmol, manufactured by Tokyo Chemical Industry Co., Ltd.) were added, and the temperature was raised to 100° C. while stirring to start the reaction. After 10 hours therefrom, the mixture was allowed to be cooled to room temperature, and then reprecipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol. The obtained brown powder was vacuum dried for 24 hours to obtain 13 g of a resin (P1-1-5).

The weight average molecular weight Mw measured by GPC in terms of polystyrene was 2700, and the polydispersity Mw/Mn was 1.5.

The ratio of the repeating structure estimated from the charged amount of each raw material (the ratio of each repeating structure in the structural formula (molar ratio)) is l/m=98/2.

The obtained resin (P1-1-5) was subjected to NMR measurement, and the molecular structure was identified from the following analysis results.

$^{13}$C-NMR=46 (1C, Ar3C—H), 110-143 (23C, ArC)

Resin (P1-1-5)

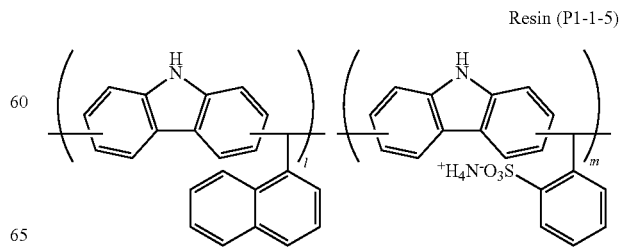

The acid value of the resin (P1-1-5) measured by the same method as that of the resin (P1-1-1) was 3.6 mg/g. From this, it can be confirmed that the resin (P1-1-5) has a site that acts as an acid derived from sodium sulfobenzaldehyde.

Production Example 6

<Production Example of Resin (P1-1-6)>

10.9 g of 1-pyrenol (50 mmol, manufactured by Tokyo Chemical Industry Co., Ltd.), 5.3 g of benzaldehyde (49 mmol, manufactured by Tokyo Chemical Industry Co., Ltd.), 0.21 g of sodium sulfobenzaldehyde (1 mmol, manufactured by Tokyo Chemical Industry Co., Ltd.), 38 g of gamma butyrolactone, and 1.0 g of methanesulfonic acid (10 mmol, manufactured by Tokyo Chemical Industry Co., Ltd.) were added, and the temperature was raised to 120° C. while stirring to start the reaction. After 11 hours therefrom, the mixture was allowed to be cooled to room temperature, and then re-precipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol. The obtained brown powder was vacuum dried for 24 hours to obtain 13 g of a resin (P1-1-6).

The weight average molecular weight Mw measured by GPC in terms of polystyrene was 3,900, and the polydispersity Mw/Mn was 2.1.

A ratio of the repeating structure estimated from the charged amount of each raw material (ratio of each repeating structure in the structural formula (molar ratio)) is l/m=98/2.

The obtained resin (P1-1-6) was subjected to NMR measurement, and the molecular structure was identified from the following analysis results.

$^{13}$C-NMR=46 (1C, Ar3C—H), 108-152 (23C, ArC)

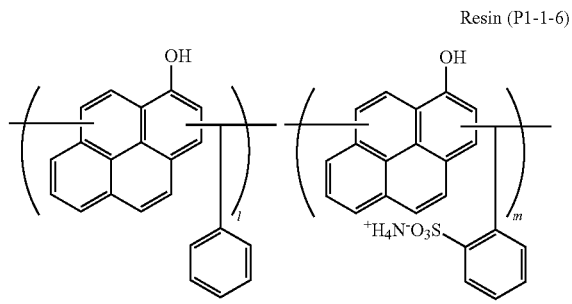

Resin (P1-1-6)

The acid value of the resin (P1-1-6) measured by the same method as that of the resin (P1-1-1) was 3.6 mg/g. From this, it can be confirmed that the resin (P1-1-6) has a site that acts as an acid derived from sodium sulfobenzaldehyde.

Production Example 7

<Production Example of Resin (P1-1-7)>

10.9 g of 1-pyrenol (50 mmol, manufactured by Tokyo Chemical Industry Co., Ltd.), 8.9 g of 4-phenylbenzaldehyde (49 mmol, manufactured by Tokyo Chemical Industry Co., Ltd.), 0.21 g of sodium sulfobenzaldehyde (1 mmol, manufactured by Tokyo Chemical Industry Co., Ltd.), 54 g of gamma butyrolactone, and 1.0 g of methanesulfonic acid (10 mmol, manufactured by Tokyo Chemical Industry Co., Ltd.) were added, and the temperature was raised to 120° C. while stirring to start the reaction. After 13 hours therefrom, the mixture was allowed to be cooled to room temperature, and then re-precipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol. The obtained brown powder was vacuum dried for 24 hours to obtain 16 g of a resin (P1-1-7).

The weight average molecular weight Mw measured by GPC in terms of polystyrene was 4,000, and the polydispersity Mw/Mn was 2.1.

A ratio of the repeating structure estimated from the charged amount of each raw material (ratio of each repeating structure in the structural formula (molar ratio)) is l/m=98/2.

The obtained resin (P1-1-7) was subjected to NMR measurement, and the molecular structure was identified from the following analysis results.

$^{13}$C-NMR=46 (1C, Ar3C—H), 108-152 (27C, ArC)

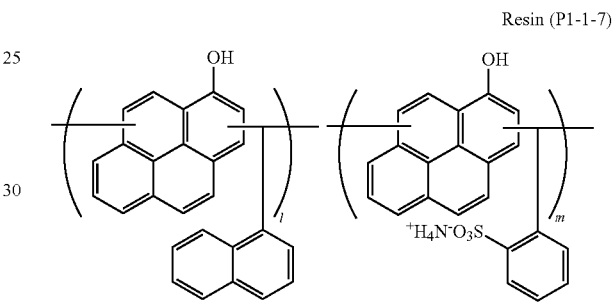

Resin (P1-1-7)

The acid value of the resin (P1-1-7) measured by the same method as that of the resin (P1-1-1) was 2.8 mg/g. From this, it can be confirmed that the resin (P1-1-7) has a site that acts as an acid derived from sodium sulfobenzaldehyde.

Comparative Production Example 1

<Production Example of Resin (P-1)>

9.7 g of 2-phenylindole (50 mmol, manufactured by Tokyo Chemical Industry Co., Ltd.), 11.5 g of 1-pyrene carboxyaldehyde (50 mmol, manufactured by Aldrich), 54 g of gamma butyrolactone, and 1.0 g of methanesulfonic acid (10 mmol, manufactured by Tokyo Chemical Industry Co., Ltd.) were added, and the temperature was raised to 100° C. while stirring to start the reaction. After 15 hours therefrom, the mixture was allowed to be cooled to room temperature, and then re-precipitated into 300 g of a 9:1 mixed solution of methanol and a 5% aqueous ammonia solution. The obtained precipitate was filtered and washed with 300 g of a 9:1 mixed solution of methanol and a 5% aqueous ammonia solution, and further washed with 300 g of methanol. The obtained brown powder was vacuum dried for 24 hours to obtain 19 g of a resin (P-1).

The weight average molecular weight Mw measured by GPC in terms of polystyrene was 2,500, and the polydispersity Mw/Mn was 1.4.

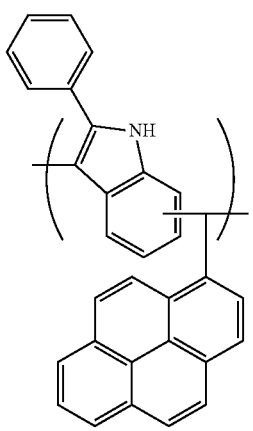

Resin (P-1)

Comparative Production Example 2

<Production Example of Resin (P-2)>

10.9 g of 1-pyrenol (50 mmol, manufactured by Tokyo Chemical Industry Co., Ltd.), 5.5 g of benzaldehyde (50 mmol, manufactured by Tokyo Chemical Industry Co., Ltd.), 38 g of gamma butyrolactone, and 1.0 g of methanesulfonic acid (10 mmol, manufactured by Tokyo Chemical Industry Co., Ltd.) were added, and the temperature was raised to 120° C. while stirring to start the reaction. After 10 hours therefrom, the mixture was allowed to cool to room temperature and then re-precipitated into 300 g of a 9:1 mixed solution of methanol and pure water. The obtained precipitate was filtered and washed twice with 300 g of methanol. The obtained black powder was vacuum dried for 24 hours to obtain 12 g of a resin (P-2). The weight average molecular weight Mw measured by GPC in terms of polystyrene was 4,100, and the polydispersity Mw/Mn was 2.1.

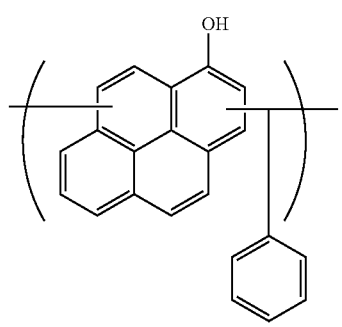

Resin (P-2)

Comparative Production Example 3

<Production Example of Resin (P-3)>

28 g of 1-naphthol (198 mmol, manufactured by Tokyo Chemical Industry Co., Ltd.), 1.0 g of naphthalene-1-sulfonic acid (2.0 mmol, manufactured by Aldrich), 12.5 g of pure water, and 7.5 g of 37% aqueous formalin solution (manufactured by Tokyo Chemical Industry Col., Ltd.) were added in a 100 mL flask, and the temperature was raised to 100° C. while stirring to start the reaction. After 4 hours therefrom, the mixture was allowed to cool to room temperature, 5 g of a 10% aqueous ammonia solution was added, the mixture was further stirred for 30 minutes, and 125 mL of methyl isobutyl ketone was added to dissolve the mixture. The solution was washed 5 times with 200 mL of pure water, and then the solvent, ammonia, and an unreacted monomer were removed under reduced pressure to obtain a resin (P-3).

The weight average molecular weight Mw measured by GPC in terms of polystyrene was 3,500, and the polydispersity Mw/Mn was 3.3.

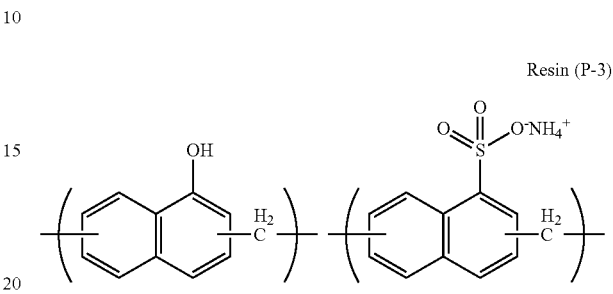

Resin (P-3)

The acid value of the resin (P-3) measured by the same method as that of the resin (P1-1-1) was 4.4 mg/g. From this, it can be confirmed that the resin (P-3) has a site that acts as an acid derived from naphthalene-1-sulfonic acid.

Examples 1 to 7 and Comparative Examples 1 to 4

<Preparation of Hard-Mask Forming Composition>

Each component shown in Tables 1 and 2 was mixed and dissolved to prepare a hard-mask forming composition of each example (solid concentration 15% by mass).

TABLE 1

| | Resin component | Crosslinking agent | Surfactant | Solvent |
|---|---|---|---|---|
| Example 1 | (P1)-1 [100] | (C)-1 [20] | (A)-1 [0.10] | (S)-1 [680] |
| Example 2 | (P1)-2 [100] | (C)-1 [20] | (A)-1 [0.10] | (S)-1 [680] |
| Example 3 | (P1)-3 [100] | (C)-1 [20] | (A)-1 [0.10] | (S)-1 [680] |
| Example 4 | (P1)-4 [100] | (C)-1 [20] | (A)-1 [0.10] | (S)-1 [680] |
| Example 5 | (P1)-5 [100] | (C)-1 [20] | (A)-1 [0.10] | (S)-1 [680] |
| Example 6 | (P1)-6 [100] | (C)-1 [20] | (A)-1 [0.10] | (S)-1 [680] |
| Example 7 | (P1)-7 [100] | (C)-1 [20] | (A)-1 [0.10] | (S)-1 [680] |

TABLE 2

| | Resin component | Crosslinking agent | Thermal acid generator | Surfactant | Solvent |
|---|---|---|---|---|---|
| Comparative Example 1 | (P)-1 [100] | (C)-1 [20] | — | (A)-1 [0.10] | (S)-1 [680] |
| Comparative Example 2 | (P)-1 [100] | (C)-1 [20] | (T)-1 [2.0] | (A)-1 [0.10] | (S)-1 [680] |
| Comparative Example 3 | (P)-2 [100] | (C)-1 [20] | (T)-1 [2.0] | (A)-1 [0.10] | (S)-1 [680] |
| Comparative Example 4 | (P)-3 [100] | (C)-1 [20] | (T)-1 [2.0] | (A)-1 [0.10] | (S)-1 [680] |

Each abbreviation in Tables 1 and 2 is defined as follows. The numerical values in [ ] are blending amounts (parts by mass).

(P1)-1 to (P1)-7: the resins (P1-1-1) to (P1-1-7).
(P)-1 to (P)-3: the resins (P-1) to (P-3).
(C)-1: A crosslinking agent represented by Chemical Formula (C-1) (manufactured by Sanwa Chemical Co., Ltd.; product name "MX270").

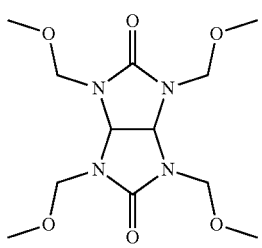
(C-1)

(A)-1: Fluorinated surfactant (manufactured by DIC Corporation; product name "R-40")
(S)-1: Cyclohexanone
(T)-1: Thermal acid generator (manufactured by KING Industry; product name "TAG-2689")

<Evaluation>

Using the hard-mask forming composition of each example, etching resistance, outgassing reduction property, and solvent resistance were evaluated by the methods shown below. The results are shown in Tables 3 and 4.

[Evaluation of Etching Resistance]

The hard-mask forming composition of each example was applied onto a silicon wafer using a spin coater and baked on a hot plate at 350° C. for 60 seconds to form a hard mask layer (film thickness 500 nm).

The formed hard mask layer was subjected to dry etching, and the amount of film loss was measured to obtain an etching rate ratio.

The measurement conditions for the amount of film loss due to dry etching were set as follows.

Processing time: 3 minutes using TCP-type dry etching apparatus
Gas: $CF_4/N_2$

The etching rate ratio was calculated as the ratio of the amount of film loss of the hard mask layer to the amount of film loss of a layer of a general cresol novolak resin (PA) represented by Chemical Formula (P-A) (etching rate ratio= (amount of film loss in the hard mask layer of each example)/(amount of film loss in the layer cresol novolak resin (PA)). It means that the lower the value is, the higher the etching resistance is.

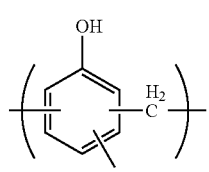
(P-A)

[Evaluation of Outgassing Reduction Properties]

The hard-mask forming composition of each example was applied onto a silicon wafer using a spin coater and baked on a hot plate at 240° C. for 60 seconds to form a hard mask layer (film thickness 500 nm).

For the formed hard mask layer of each example, the temperature was raised to 240° C. to 350° C. at a temperature rising rate of 10° C./min using a thermogravimetric differential thermal analyzer (TG-DTA). For the hard mask layer of each example, how much the weight of the hard mask layer was reduced when heated at 350° C., compared to when heated at 240° C. was measured, and the outgassing reduction property of the hard mask layer was evaluated from the weight reduction rate (%).

[Evaluation of Solvent Resistance]

The hard-mask forming composition of each example was applied onto a silicon wafer using a spin coater and baked on a hot plate at 350° C. for 60 seconds to form a hard mask layer (film thickness 500 nm).

N,N-dimethylformamide was brought into contact with the formed hard mask layer, and the solvent resistance was evaluated according to the following evaluation criteria.

Evaluation Criteria

A: In a case where the hard mask layer is not dissolved in N,N-dimethylformamide
B: In a case where the hard mask layer is dissolved in N,N-dimethylformamide

TABLE 3

| | Etching resistance Etching rate ratio | Outgassing reduction property Weight reduction rate | Solvent resistance |
|---|---|---|---|
| Example 1 | 0.68 | 3.3% | A |
| Example 2 | 0.65 | 3.1% | A |
| Example 3 | 0.64 | 3.2% | A |
| Example 4 | 0.65 | 3.2% | A |
| Example 5 | 0.68 | 3.3% | A |
| Example 6 | 0.68 | 3.0% | A |
| Example 7 | 0.67 | 2.9% | A |

TABLE 4

| | Etching resistance Etching rate ratio | Outgassing reduction property Weight reduction rate | Solvent resistance |
|---|---|---|---|
| Comparative Example 1 | 0.65 | 3.0% | B |
| Comparative Example 2 | 0.65 | 3.8% | A |
| Comparative Example 3 | 0.69 | 3.7% | A |
| Comparative Example 4 | 0.80 | 6.1% | A |

As shown in Tables 3 and 4, the hard mask layer using the hard-mask forming composition of Comparative Example 1 was dissolved in N, N-dimethylformamide, and the solvent resistance was inferior. It is presumed that this is because the hard-mask forming composition of Comparative Example 1 did not contain a thermal acid generator, and thus the crosslinking reaction did not proceed sufficiently.

The hard-mask forming compositions of Comparative Examples 2 and 3 were excellent in solvent resistance, but the weight reduction rate was higher than that of the hard mask layer using the hard-mask forming compositions of Examples 1 to 7. It is presumed that this is because the hard-mask forming compositions of Comparative Examples 2 and 3 contained a thermal acid generator having a low molecular weight, thereby causing generation of outgassing.

The hard mask layer using the hard-mask forming compositions of Examples 1 to 7 had a lower etching rate ratio than the hard mask layer using the hard-mask forming composition of Comparative Example 4. It is presumed that this is because a bonding portion of the repeating unit of the main chain of the resin contained in the hard mask forming composition of Comparative Example 4 is secondary carbon (—$CH_2$—), whereas a bonding portion of the repeating unit of the main chain of the resin contained in the hard-mask forming compositions of Examples 1 to 7 is tertiary carbon (—$CHAr^{01}$—), and thus the resins contained in the hard-mask forming composition of Examples 1 to 7 have a large proportion of carbon amongst all atoms, and the Ohnishi parameter of the resin as a whole can be lowered.

In addition, it is presumed that since the resins contained in the hard-mask forming compositions of Examples 1 to 7 have a site in the side chain that acts as an acid by heating, the resins are less affected by steric damage than the resin having a site that acts as an acid by heating on the main chain contained in the hard-mask forming composition of Comparative Example 4, and thus the effect of promoting cross-linking as an acid catalyst could be further enhanced.

As described above, it can be confirmed that according to the hard-mask forming compositions of Examples 1 to 7, it is possible to form a hard mask layer having less generation of outgassing during baking and favorable etching resistance and solvent resistance.

While preferred embodiments of the invention have been described and illustrated above, it should be understood that these are exemplary of the invention and are not to be considered as limiting. Additions, omissions, substitutions, and other modifications can be made without departing from the scope of the invention. Accordingly, the invention is not to be considered as being limited by the foregoing description, and is only limited by the scope of the appended claims.

EXPLANATION OF REFERENCES

10 Support
11 Substrate
12 Processing layer
12*p* Pattern
20 BARC layer
30 Resist film
30*p* Resist pattern
m1 Hard mask layer
m2 Hard mask layer
m1*p* Resin pattern
m2*p* Inorganic pattern
100 Electronic component

What is claimed is:

1. A hard-mask forming composition comprising:
a resin (P1) having a repeating structure (u1) represented by General Formula (u1-0):

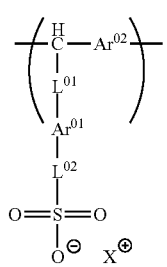

wherein $Ar^{01}$ is an aromatic hydrocarbon group which may have a substituent, $L^{01}$ and $L^{02}$ are each independently a single-bonded or divalent linking group, $Ar^{02}$ is an aromatic hydrocarbon group which may have a substituent, provided that $Ar^{02}$ has at least one nitrogen atom or oxygen atom, and X is a hydrogen atom, $NH_4$, a compound obtained by adding a hydrogen atom to an amine, or a quaternary ammonium.

2. The hard-mask forming composition according to claim 1, wherein the repeating structure (u1) is a repeating structure (u11) represented by General Formula (u1-1), a repeating structure (u12) represented by General Formula (u1-2), or a repeating structure (u13) represented by General Formula (u1-3):

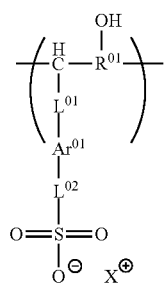

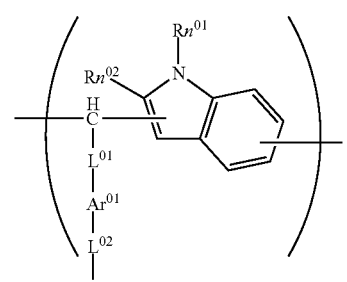

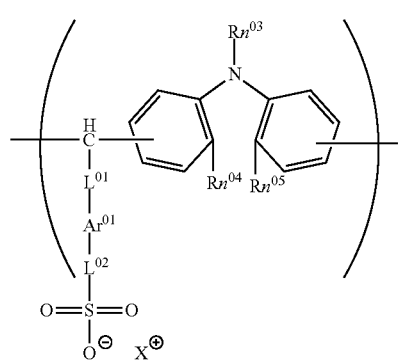

wherein, in Formulae (u1-1) to (u1-3), $Ar^{01}$ is each independently an aromatic hydrocarbon group which may have a substituent, $L^{01}$ and $L^{02}$ are each independently a single-bonded or divalent linking group, and X's are each independently a hydrogen atom, $NH_4$, a compound obtained by adding a hydrogen atom to an amine compound, or a quaternary ammonium; in Formula (u1-1), $R^{01}$ is an aromatic hydrocarbon group which may have a substituent; in Formula (u1-2), $Rn^{01}$ and $Rn^{02}$ are each independently a monovalent hydrocarbon group or hydrogen atom, in Formula (u1-3), $Rn^{03}$ to $Rn^{05}$ are each independently a monovalent hydrocarbon group or hydrogen atom, and $Rn^{04}$ and $Rn^{05}$ may be bonded to each other to form a condensed ring with a nitrogen atom in the formula.

3. The hard-mask forming composition according to claim 1, wherein the resin (P1) further has at least one repeating structure (u2) selected from the group consisting of a repeating structure (u21) represented by General Formula (u2-1), a repeating structure (u22) represented by General Formula (u2-2), and a repeating structure (u23) represented by General Formula (u2-3):

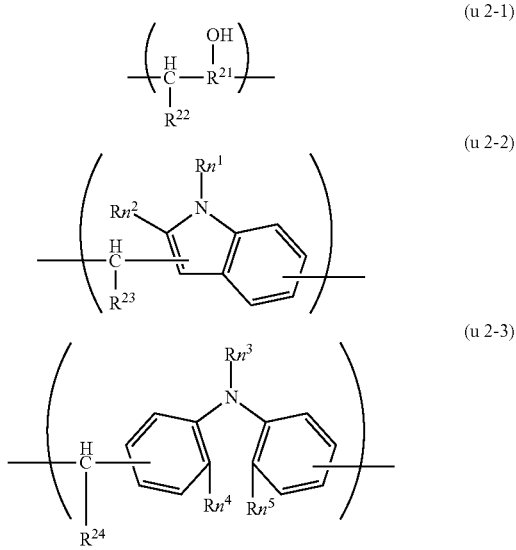

(u 2-1)

(u 2-2)

(u 2-3)

wherein, in formulae (u2-1) to (u2-3), $R^{22}$, $R^{23}$, and $R^{24}$ are each independently a hydrogen atom or an aromatic hydrocarbon group which may have a substituent, in Formula (u2-1), $R^{21}$ is an aromatic hydrocarbon group which may have a substituent, in Formula (u2-2), $Rn^1$ and $Rn^2$ are each independently a monovalent hydrocarbon group or hydrogen atom, in Formula (u2-3), $Rn^3$ to $Rn^5$ are each independently a monovalent hydrocarbon group or hydrogen atom, and $Rn^4$ and $Rn^5$ may be bonded to each other to form a condensed ring with a nitrogen atom in the formula.

4. The hard-mask forming composition according to claim 3, wherein a molar ratio of the repeating structure (u1) to the repeating structure (u2) in the resin (P1) is repeating structure (u1): repeating structure (u2)=0.5:99.5 to 10:90.

5. A method for manufacturing an electronic component, the method comprising:
forming a hard mask layer (m1) on a support using the hard-mask forming composition according to claim 1; and
processing the support using the hard mask layer (m1) as a mask.

6. A method for manufacturing an electronic component, the method comprising:
forming a hard mask layer (m1) on a support using the hard-mask forming composition according to claim 1;
forming a hard mask layer (m2) made of an inorganic material on the hard mask layer (m1);
forming a resist film on the hard mask layer (m2);
exposing the resist film and developing the exposed resist film to form a resist pattern on the hard mask layer (m2);
etching the hard mask layer (m2) using the resist pattern as a mask to form an inorganic pattern;
etching the hard mask layer (m1) using the inorganic pattern as a mask to form a resin pattern; and
processing the support using the resin pattern as a mask.

7. A method for manufacturing an electronic component, the method comprising:
forming a hard mask layer (m1) on a support using the hard-mask forming composition according to claim 1;
forming an inorganic pattern made of an inorganic material on the hard mask layer (m1);
etching the hard mask layer (m1) using the inorganic pattern as a mask to form a resin pattern; and
processing the support using the resin pattern as a mask.

8. A resin having a repeating structure (u1) represented by General Formula (u1-0):

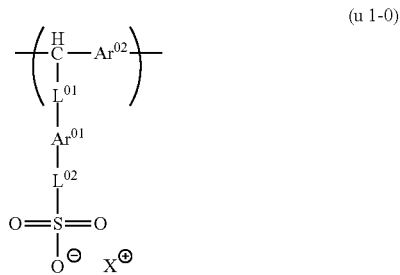

(u 1-0)

wherein $Ar^{01}$ is an aromatic hydrocarbon group which may have a substituent, $L^{01}$ and $L^{02}$ are each independently a single-bonded or divalent linking group, $Ar^{02}$ is an aromatic hydrocarbon group which may have a substituent, provided that $Ar^{02}$ has at least one nitrogen atom or oxygen atom, and X is a hydrogen atom, $NH_4$, a compound obtained by adding a hydrogen atom to an amine, or a quaternary ammonium.

* * * * *